United States Patent
Jo et al.

(10) Patent No.: US 11,634,821 B2
(45) Date of Patent: *Apr. 25, 2023

(54) METHOD FOR MANUFACTURING FILM FOR DECORATION ELEMENT

(71) Applicant: LG CHEM, LTD., Seoul (KR)

(72) Inventors: Pilsung Jo, Daejeon (KR); Song Ho Jang, Daejeon (KR); Ki Hwan Kim, Daejeon (KR); Yong Chan Kim, Daejeon (KR); Nansra Heo, Daejeon (KR); Jeong Woo Shon, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/261,777

(22) PCT Filed: Sep. 2, 2019

(86) PCT No.: PCT/KR2019/011259
§ 371 (c)(1),
(2) Date: Jan. 20, 2021

(87) PCT Pub. No.: WO2020/046087
PCT Pub. Date: Mar. 5, 2020

(65) Prior Publication Data
US 2021/0292913 A1    Sep. 23, 2021

(30) Foreign Application Priority Data

Aug. 31, 2018 (KR) .......... 10-2018-0103951
Aug. 31, 2018 (KR) .......... 10-2018-0103960

(51) Int. Cl.
*C23C 14/16* (2006.01)
*C23F 4/00* (2006.01)
*C23C 14/24* (2006.01)
*C23C 14/34* (2006.01)
*C23C 14/58* (2006.01)

(52) U.S. Cl.
CPC .............. *C23F 4/00* (2013.01); *C23C 14/165* (2013.01); *C23C 14/24* (2013.01); *C23C 14/34* (2013.01); *C23C 14/5873* (2013.01)

(58) Field of Classification Search
None
See application file for complete search history.

(56) References Cited

U.S. PATENT DOCUMENTS

| | | | |
|---|---|---|---|
| 5,635,037 A | 6/1997 | Chu et al. |
| 5,753,420 A | 5/1998 | Misium |
| 7,846,498 B2 | 12/2010 | Ido et al. |
| 8,083,957 B2 | 12/2011 | Innan |
| 9,108,389 B2 | 8/2015 | Jang et al. |

(Continued)

FOREIGN PATENT DOCUMENTS

| | | |
|---|---|---|
| CN | 1936068 A | 3/2007 |
| CN | 101396884 A | 4/2009 |

(Continued)

*Primary Examiner* — Shamim Ahmed
*Assistant Examiner* — Bradford M Gates
(74) *Attorney, Agent, or Firm* — Dentons US LLP

(57) ABSTRACT

The present disclosure relates to a method for manufacturing a film for a decoration element, the method including depositing two or more islands on one surface of a film; and forming a pattern portion by dry etching the film using the island as a mask.

14 Claims, 37 Drawing Sheets

(56) References Cited

U.S. PATENT DOCUMENTS

| | | |
|---|---|---|
| 9,139,900 B2 | 9/2015 | Endo et al. |
| 9,695,338 B2 | 7/2017 | Egashira et al. |
| 2003/0094296 A1 | 5/2003 | Kojima et al. |
| 2008/0264903 A1 | 10/2008 | Anton et al. |
| 2009/0080076 A1 | 3/2009 | Fujikura et al. |
| 2009/0096106 A1 | 4/2009 | Vrtis et al. |
| 2009/0139421 A1 | 6/2009 | Nakagawa |
| 2009/0226631 A1 | 9/2009 | Yamazaki et al. |
| 2009/0236962 A1 | 9/2009 | Fujimoto et al. |
| 2009/0261063 A1 | 10/2009 | Munzert et al. |
| 2011/0249228 A1* | 10/2011 | Kubota ............... G02F 1/1334 257/59 |
| 2011/0273356 A1 | 11/2011 | Kawaguchi et al. |
| 2013/0230796 A1 | 9/2013 | Yoshikawa et al. |
| 2014/0038320 A1* | 2/2014 | Wang .................. H01L 33/44 438/22 |
| 2016/0155967 A1* | 6/2016 | Lee .................... H01L 51/0097 257/88 |
| 2017/0191638 A1 | 7/2017 | Kwon et al. |
| 2018/0009143 A1 | 1/2018 | Abe et al. |

FOREIGN PATENT DOCUMENTS

| | | |
|---|---|---|
| CN | 101588912 A | 11/2009 |
| CN | 102282288 A | 12/2011 |
| CN | 103229099 A | 7/2013 |
| CN | 103424983 A | 12/2013 |
| CN | 105097441 A | 11/2015 |
| CN | 106663726 A | 5/2017 |
| CN | 107211549 A | 9/2017 |
| EP | 2048700 A2 | 4/2009 |
| EP | 2664961 A1 | 11/2013 |
| JP | 9-116118 A | 5/1997 |
| JP | 2002135030 A | 5/2002 |
| JP | 2006-297853 A | 11/2006 |
| JP | 2007-144988 A | 6/2007 |
| KR | 10-2003-0007056 A | 1/2003 |
| KR | 10-2011-0028356 A | 3/2011 |
| KR | 10-2012-0082111 A | 7/2012 |
| KR | 101463541 B1 | 11/2014 |
| KR | 10-2015-0013278 A | 2/2015 |
| KR | 10-2017-0122989 A | 11/2017 |
| KR | 10-2018-0019916 A | 2/2018 |
| TW | 200941790 A | 10/2009 |

\* cited by examiner

[FIG. 1]
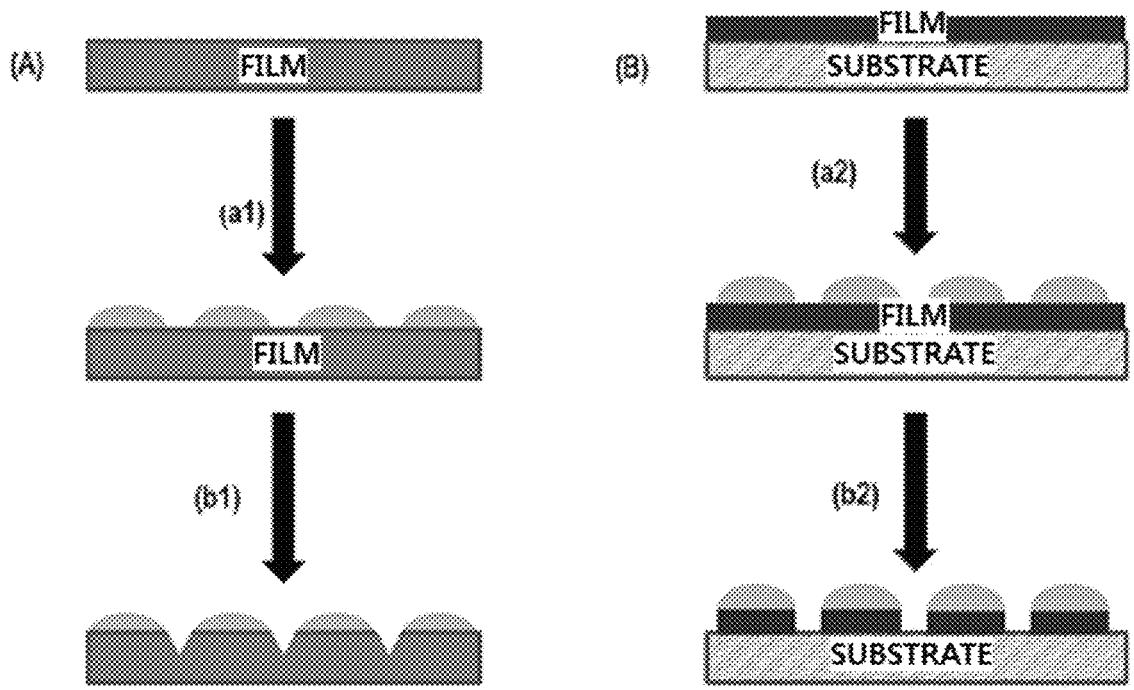
[FIG. 2]
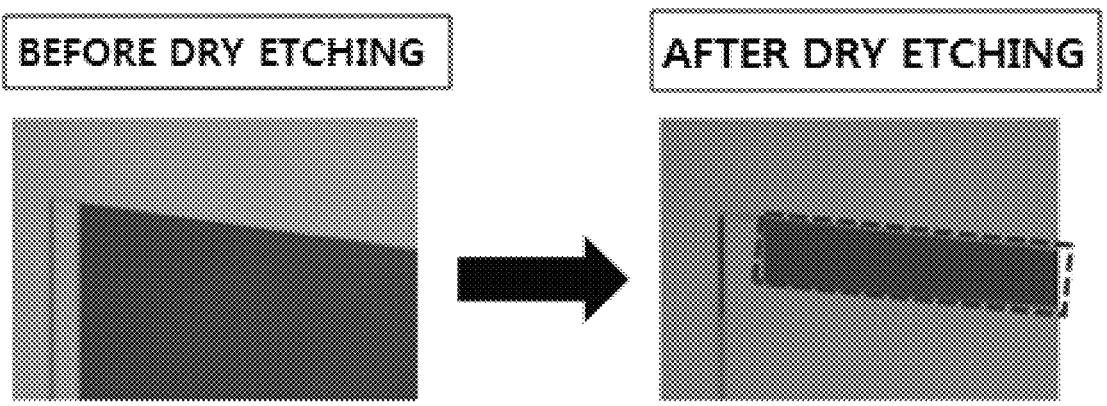

[FIG. 3]
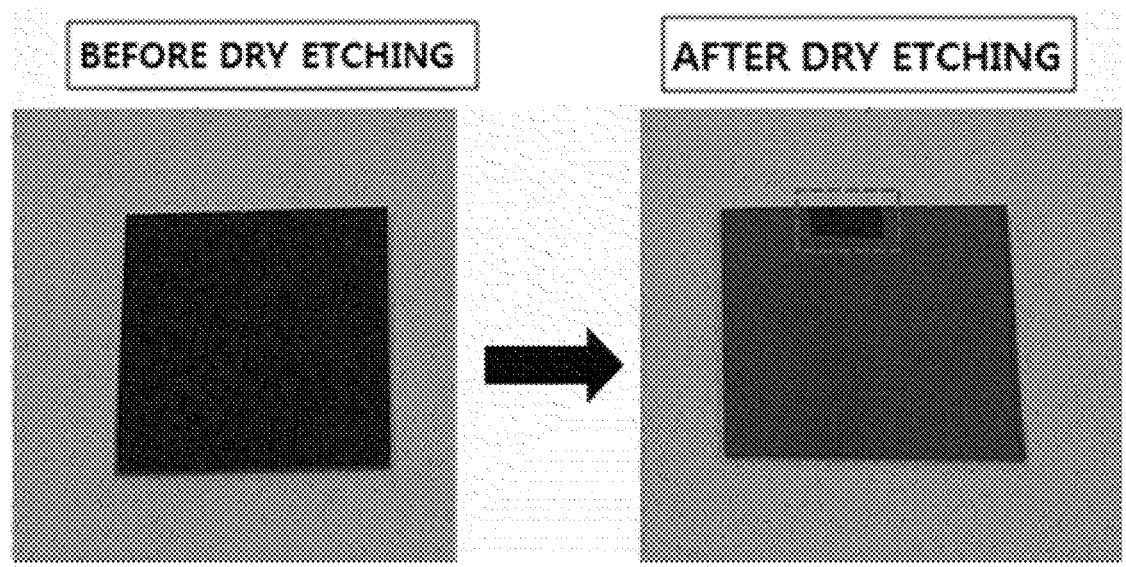
[FIG. 4]
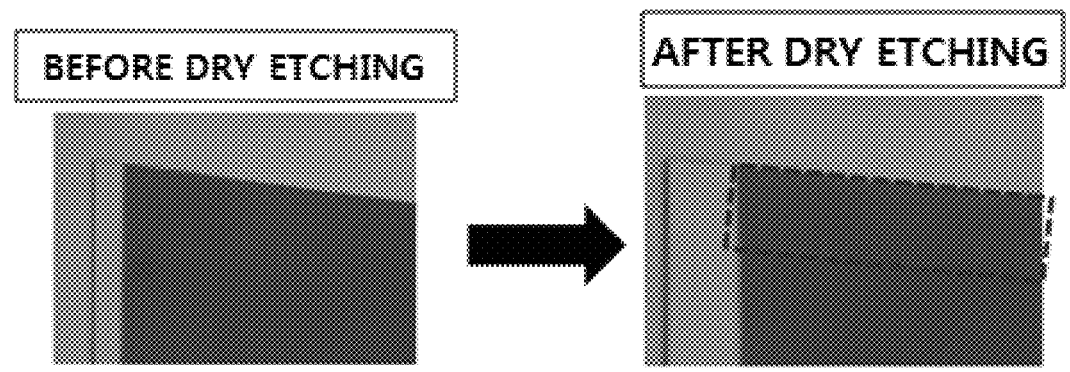

[FIG. 5]
EXAMPLE 1
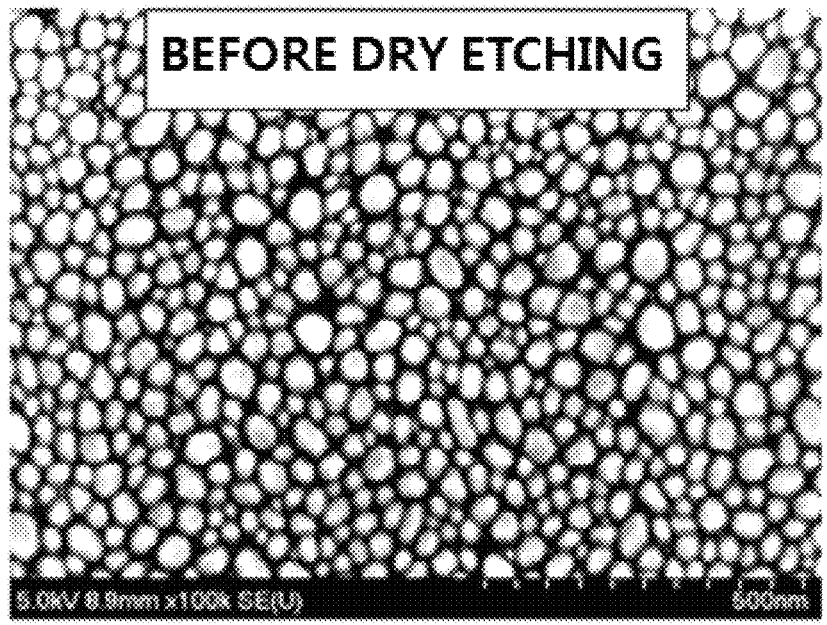
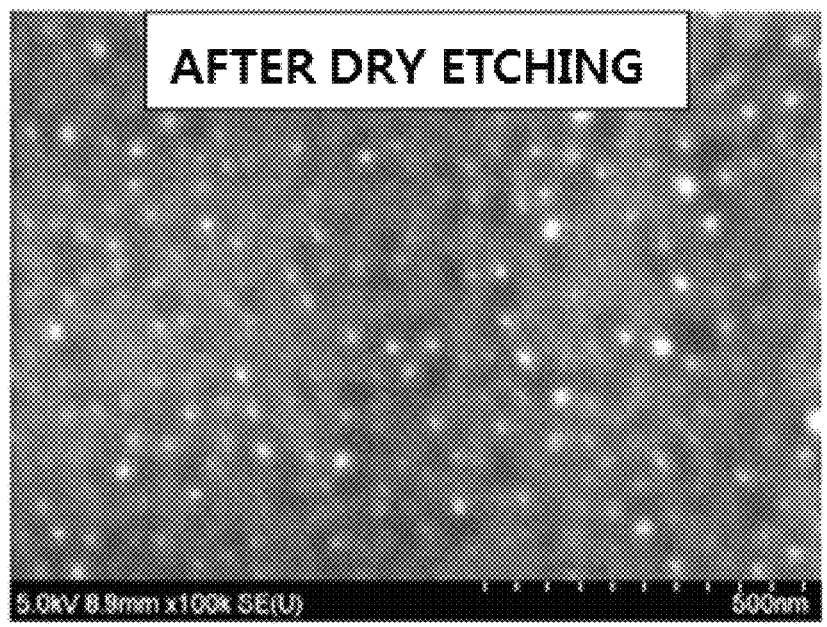

[FIG. 6]
EXAMPLE 2
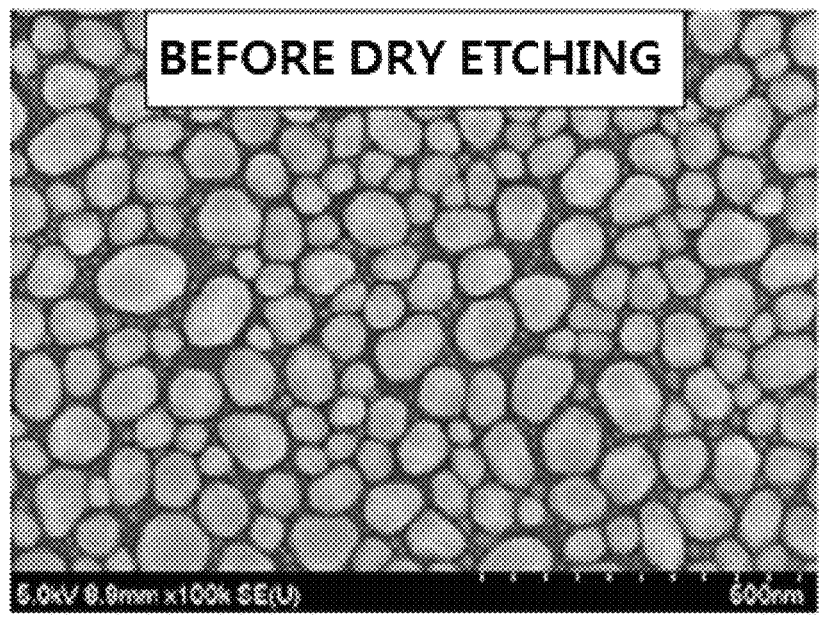
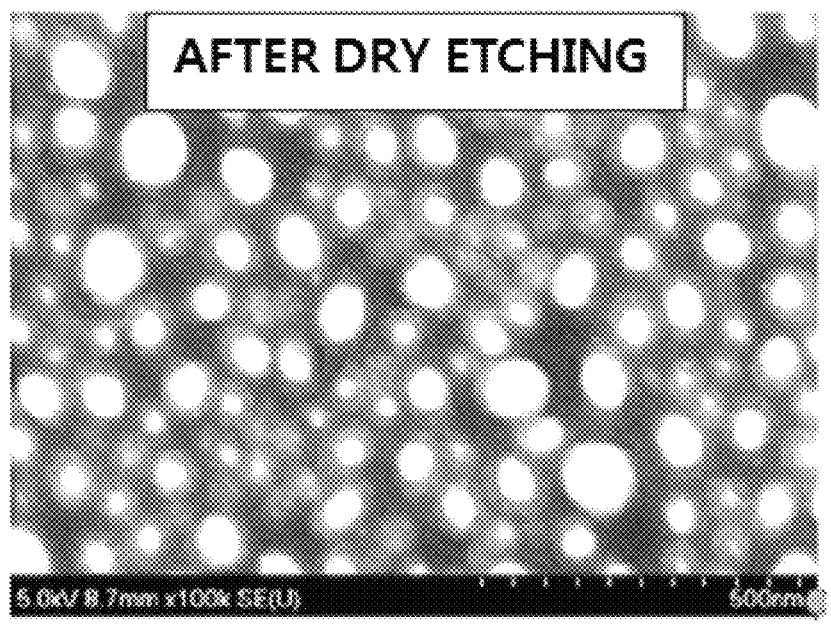

[FIG. 7]
EXAMPLE 3
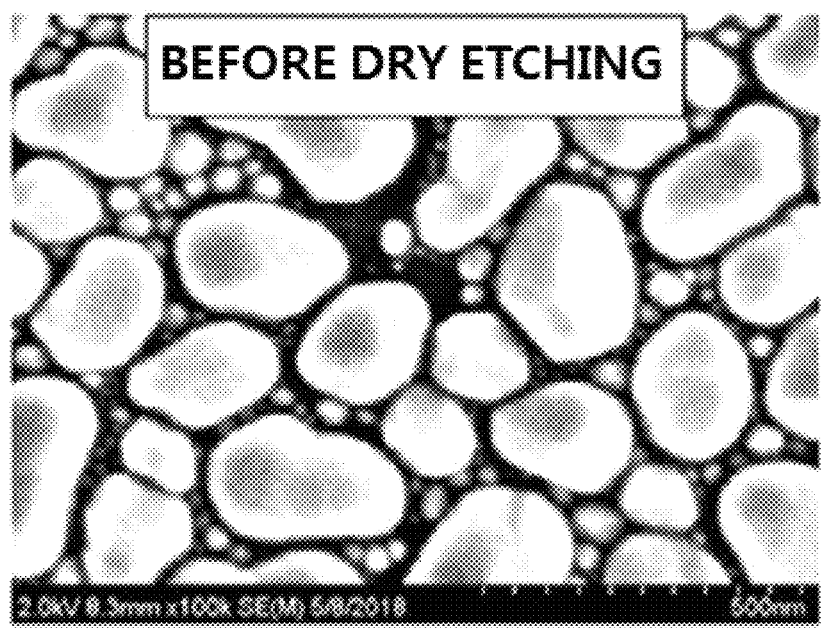
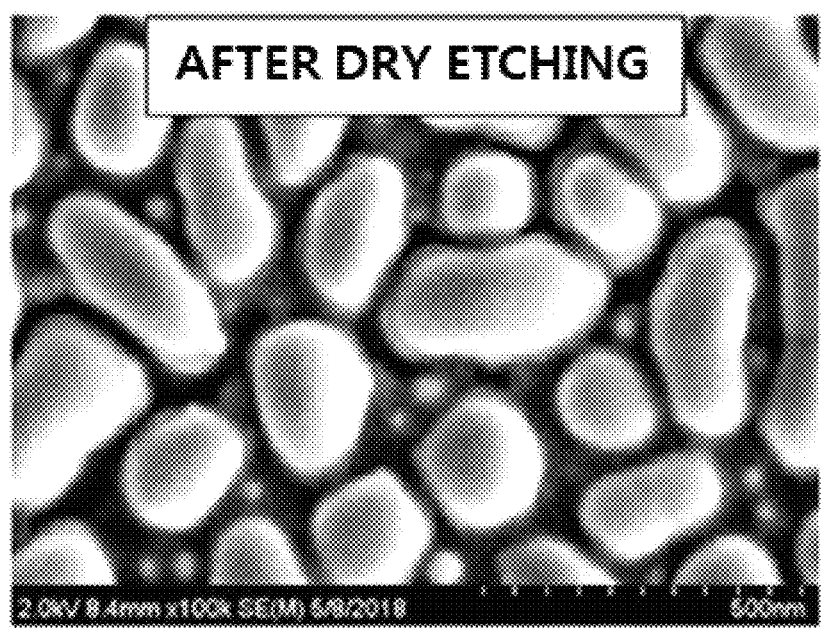

[FIG. 8]
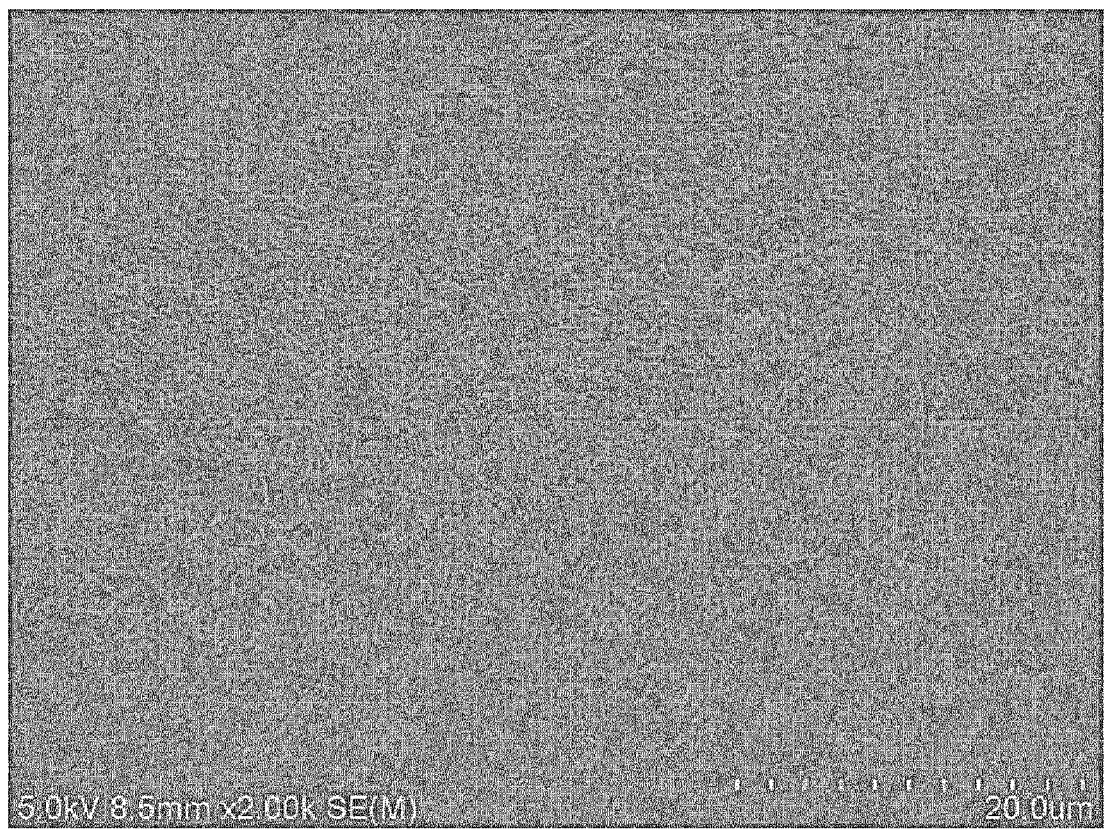

[FIG. 9]
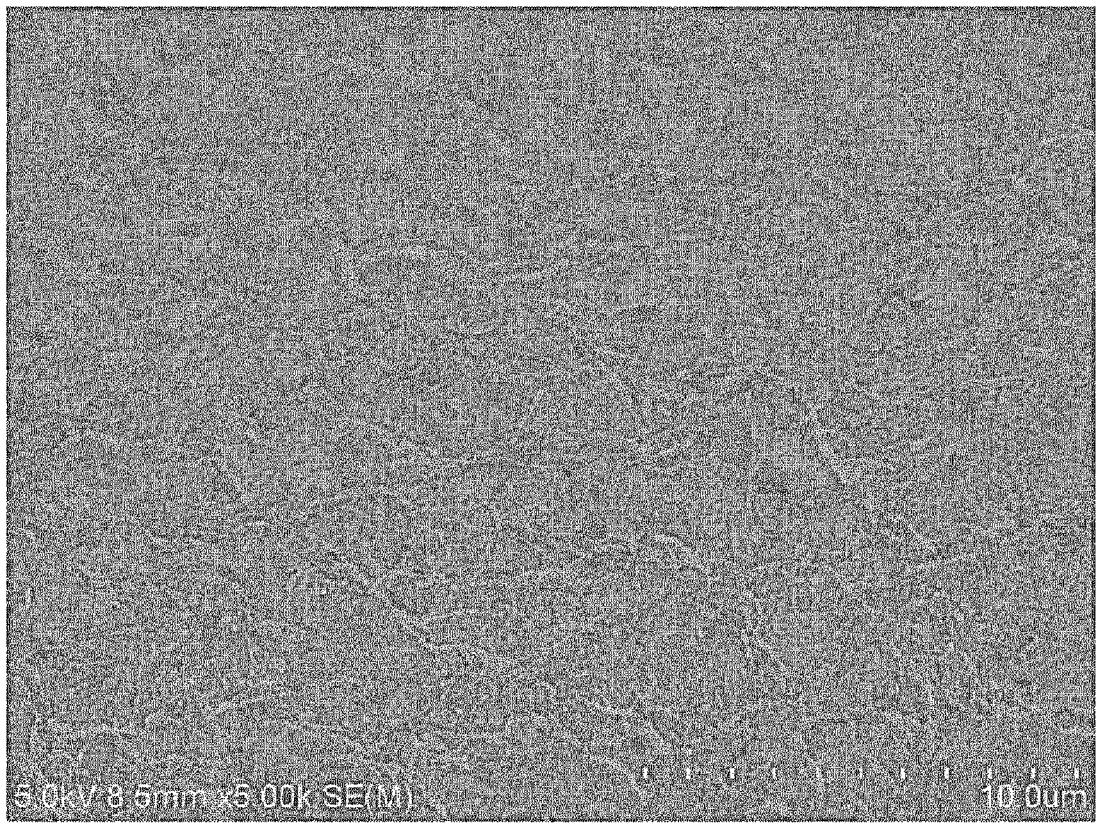

[FIG. 10]
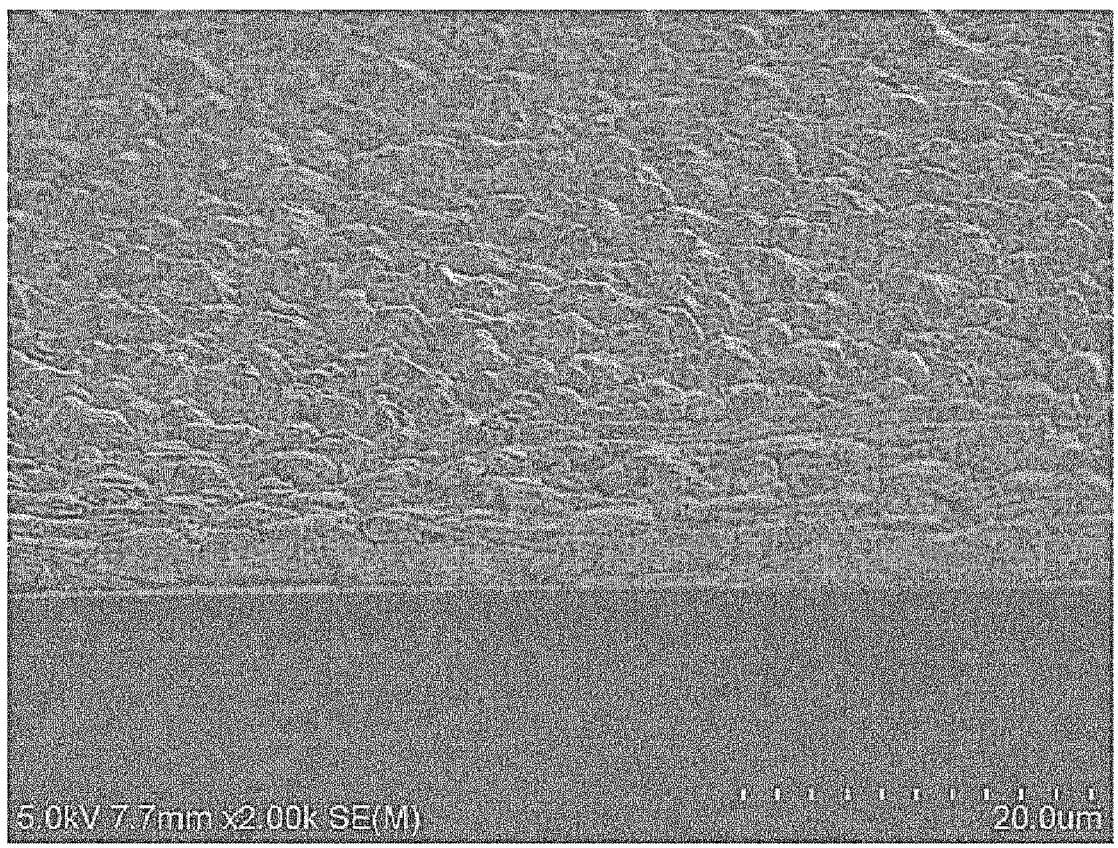

[FIG. 11]
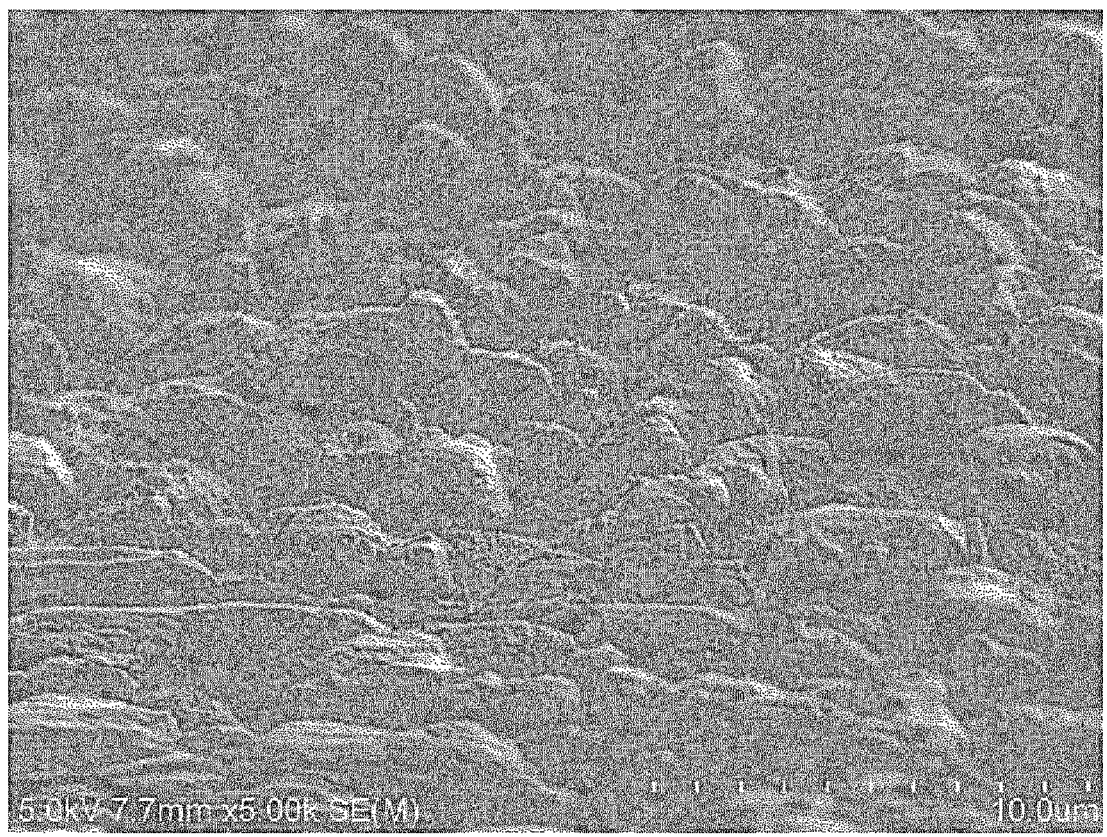

[FIG. 12]
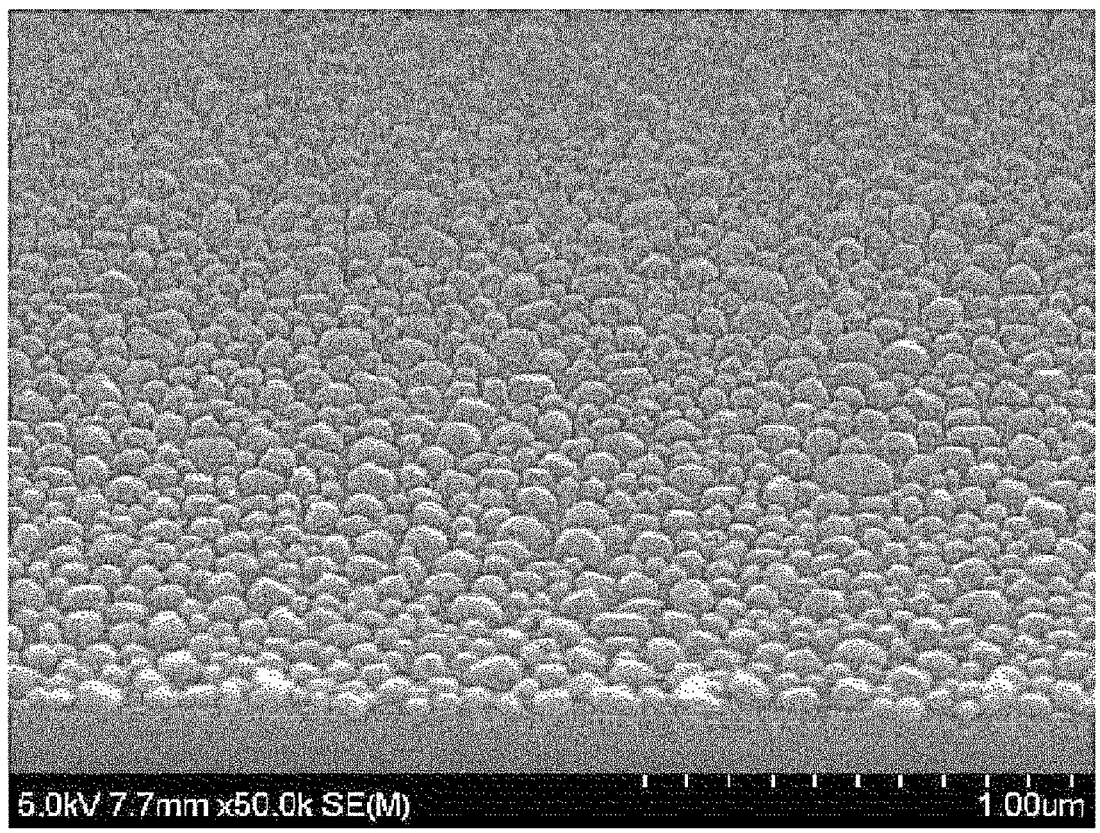

[FIG. 13]
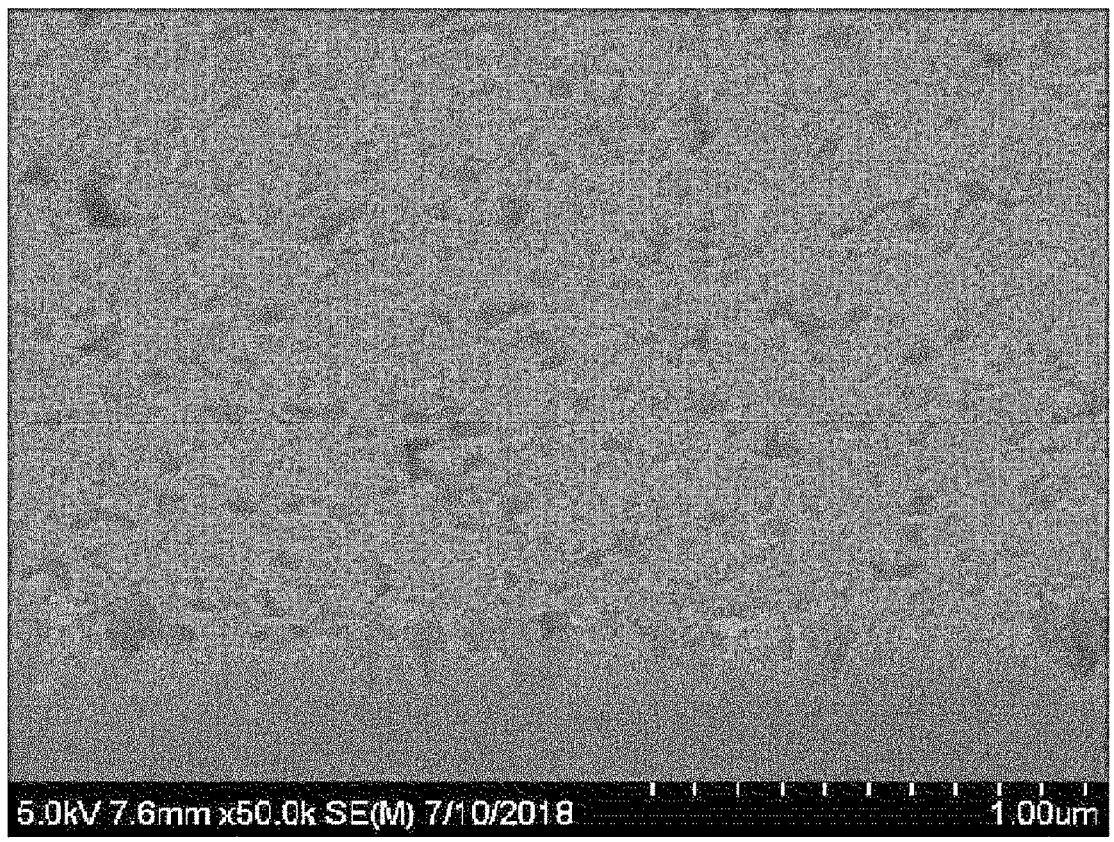

[FIG. 14]
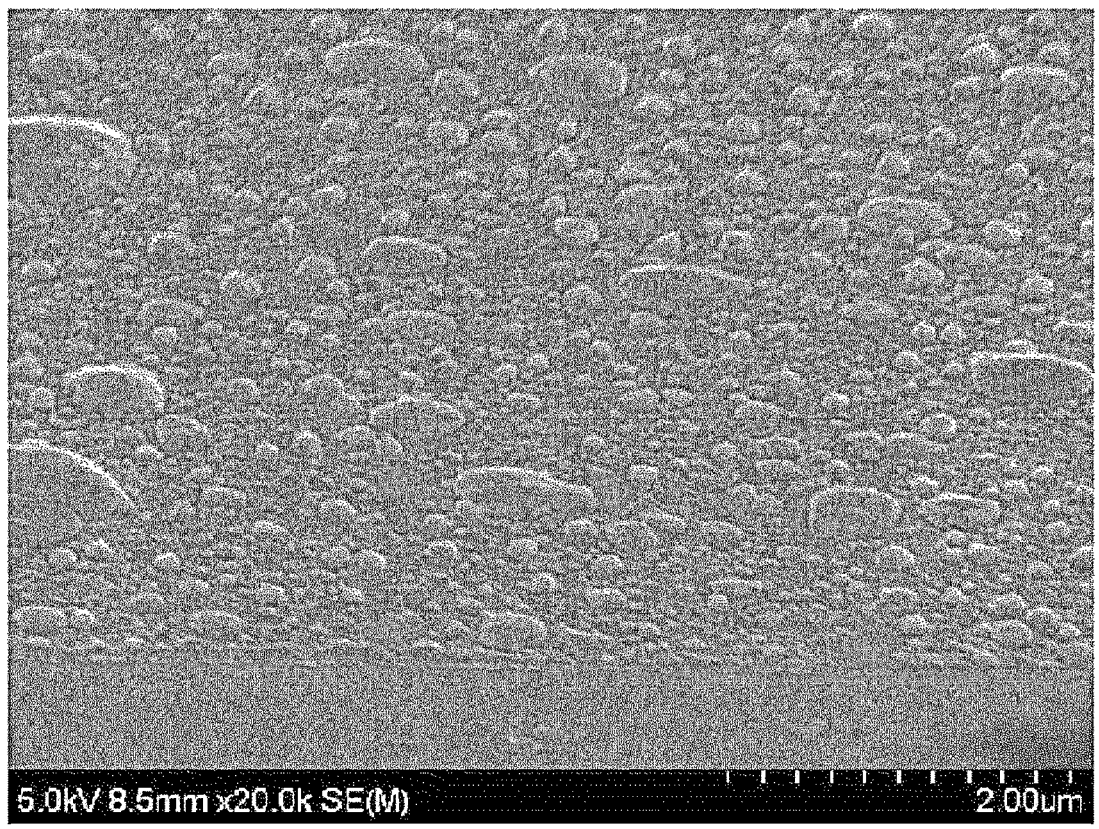

[FIG. 15]
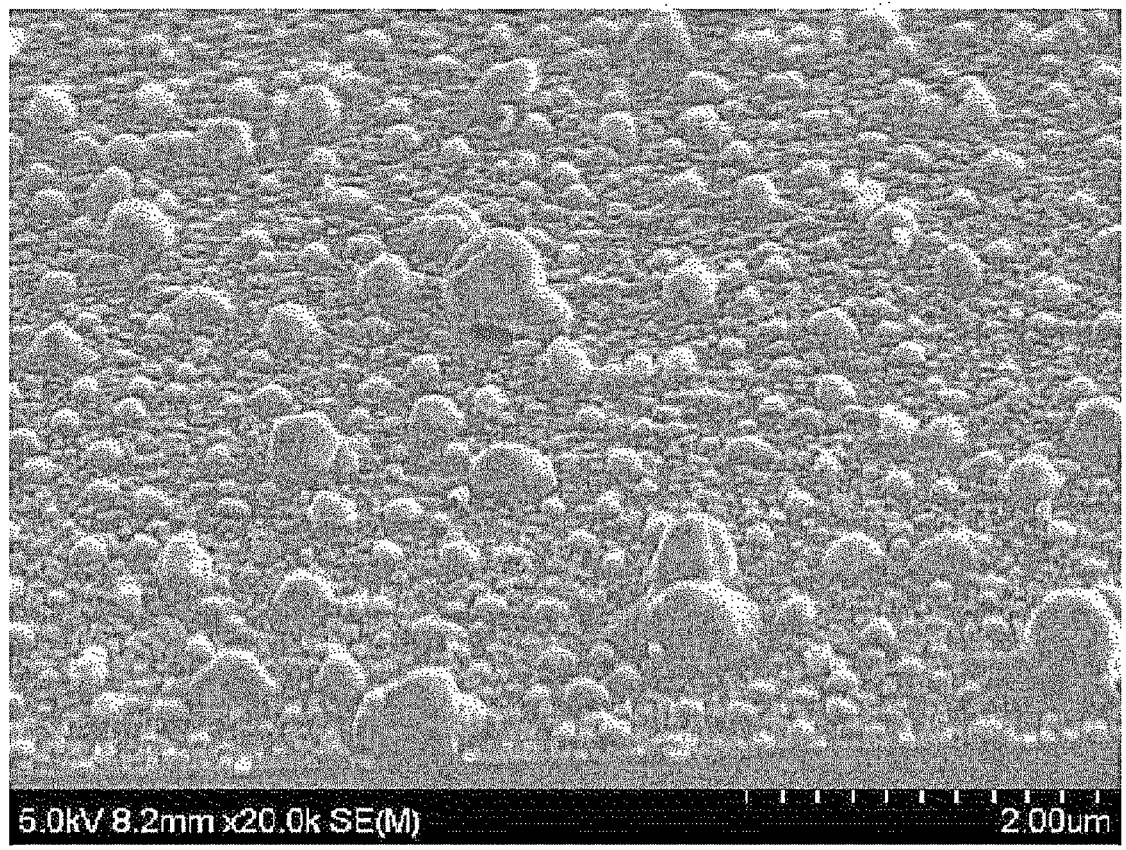

[FIG. 16]
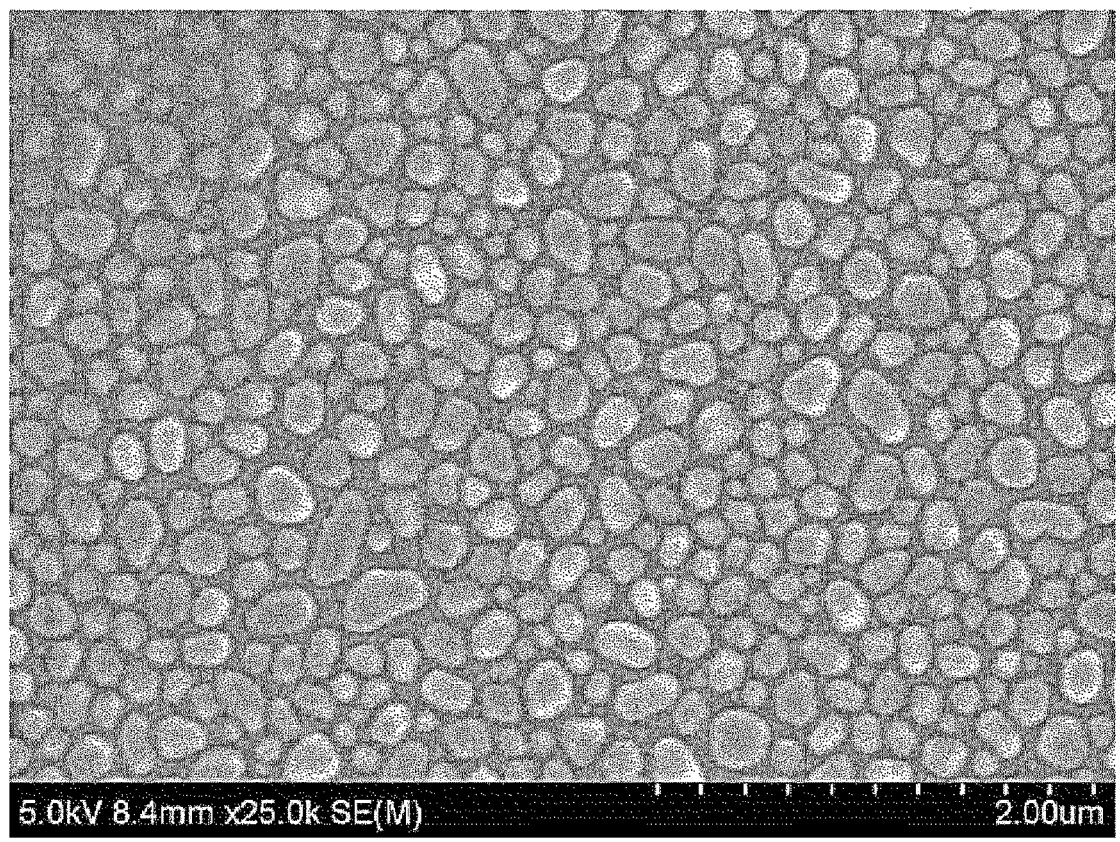

[FIG. 17]
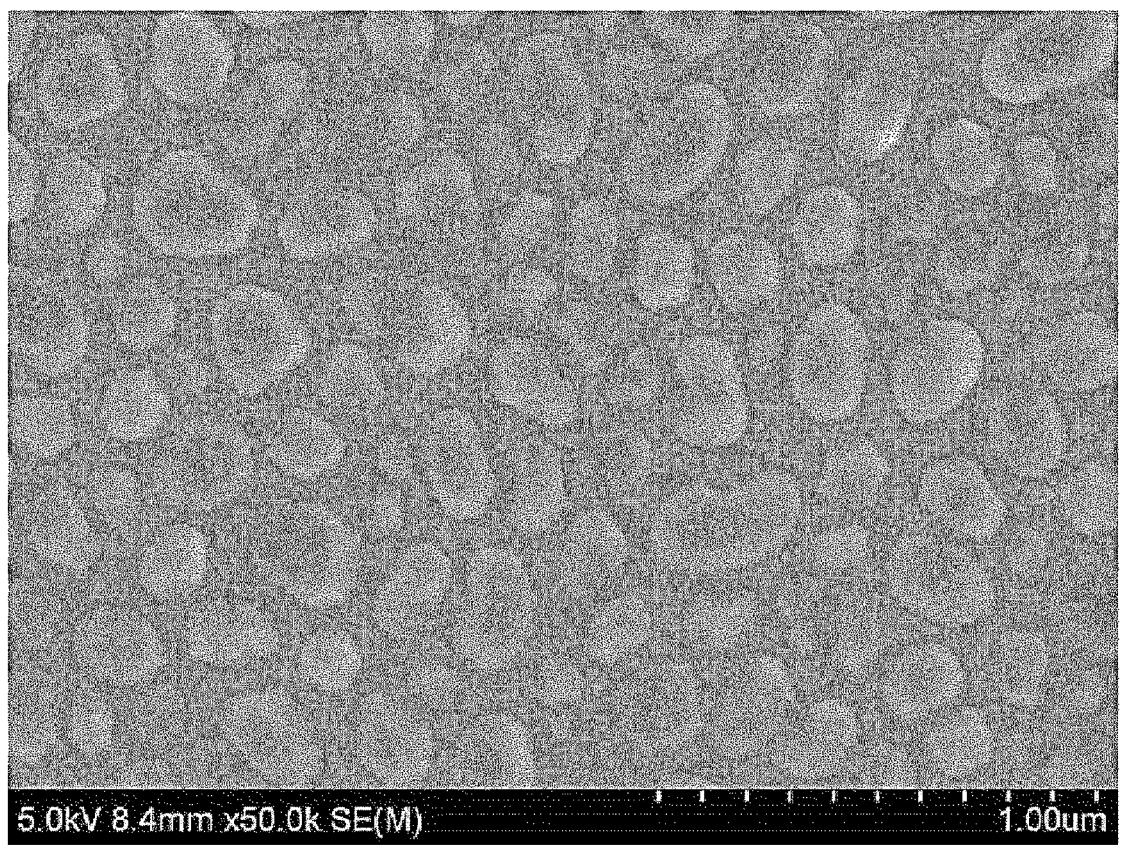

[FIG. 18]
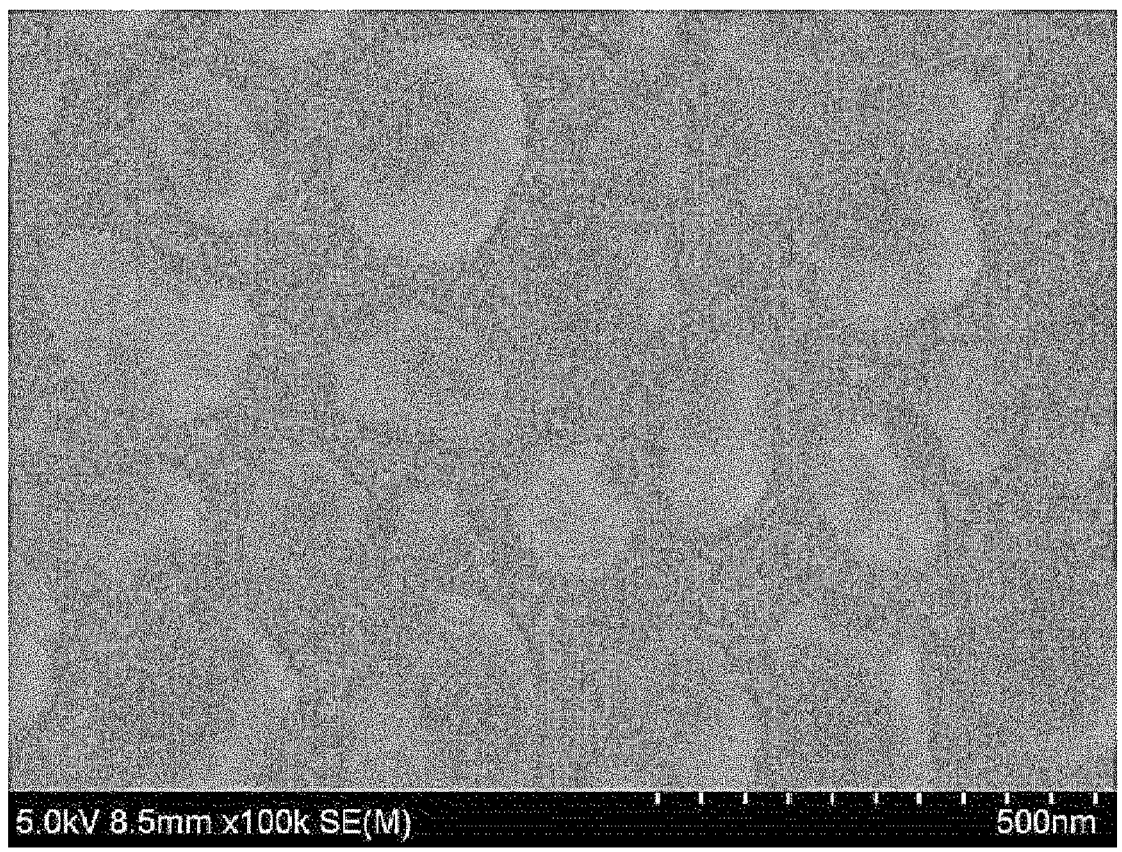

[FIG. 19]
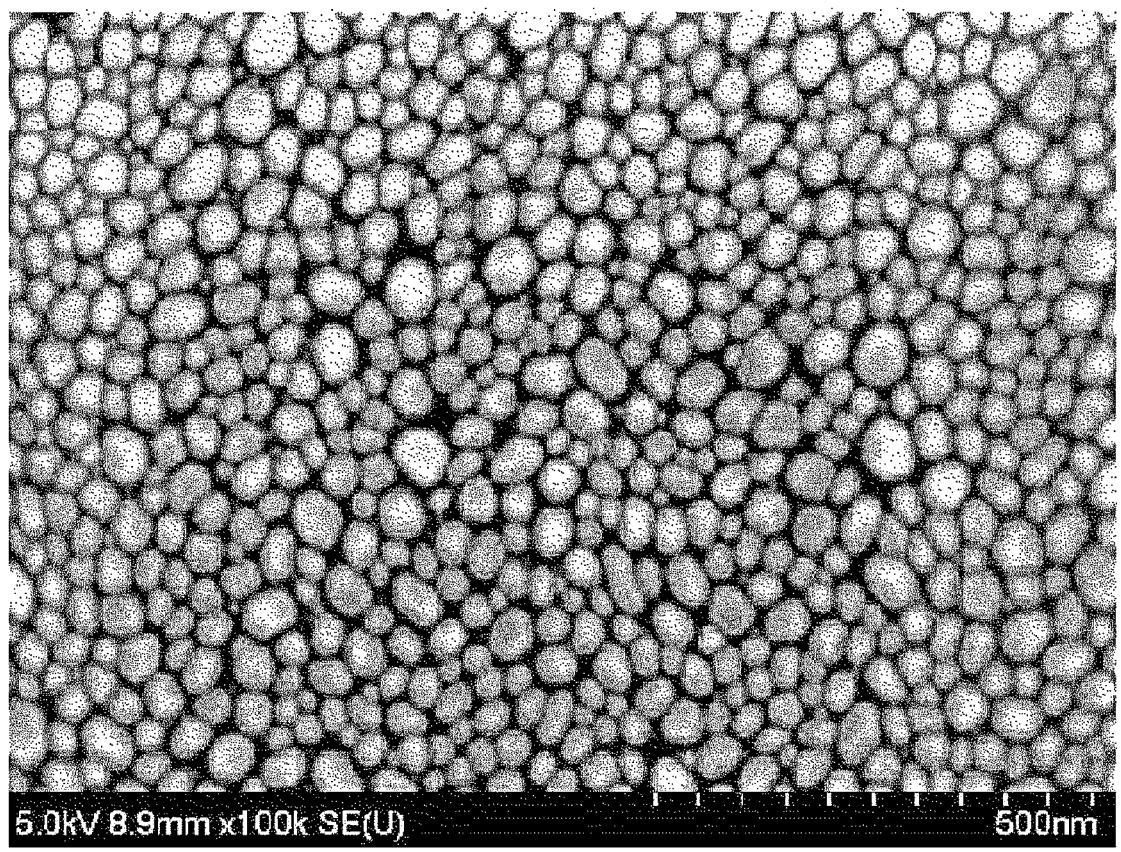

[FIG. 20]
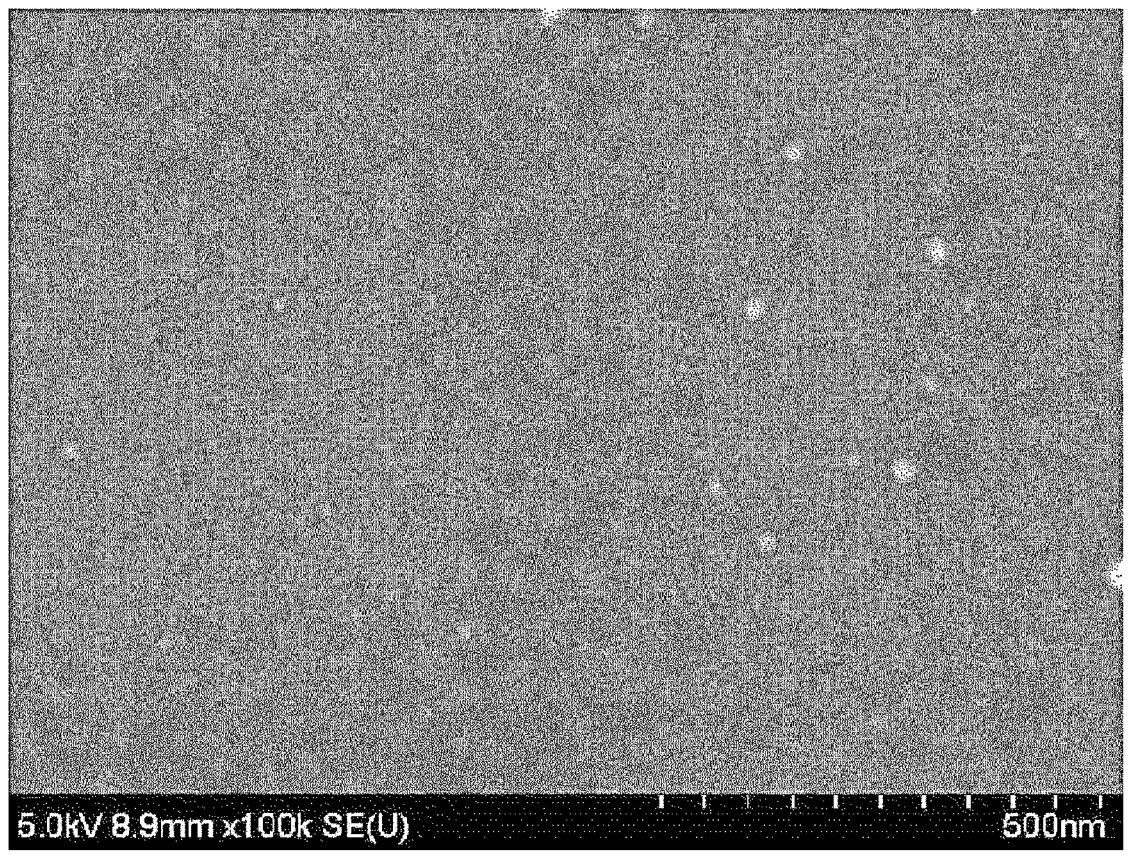

[FIG. 21]
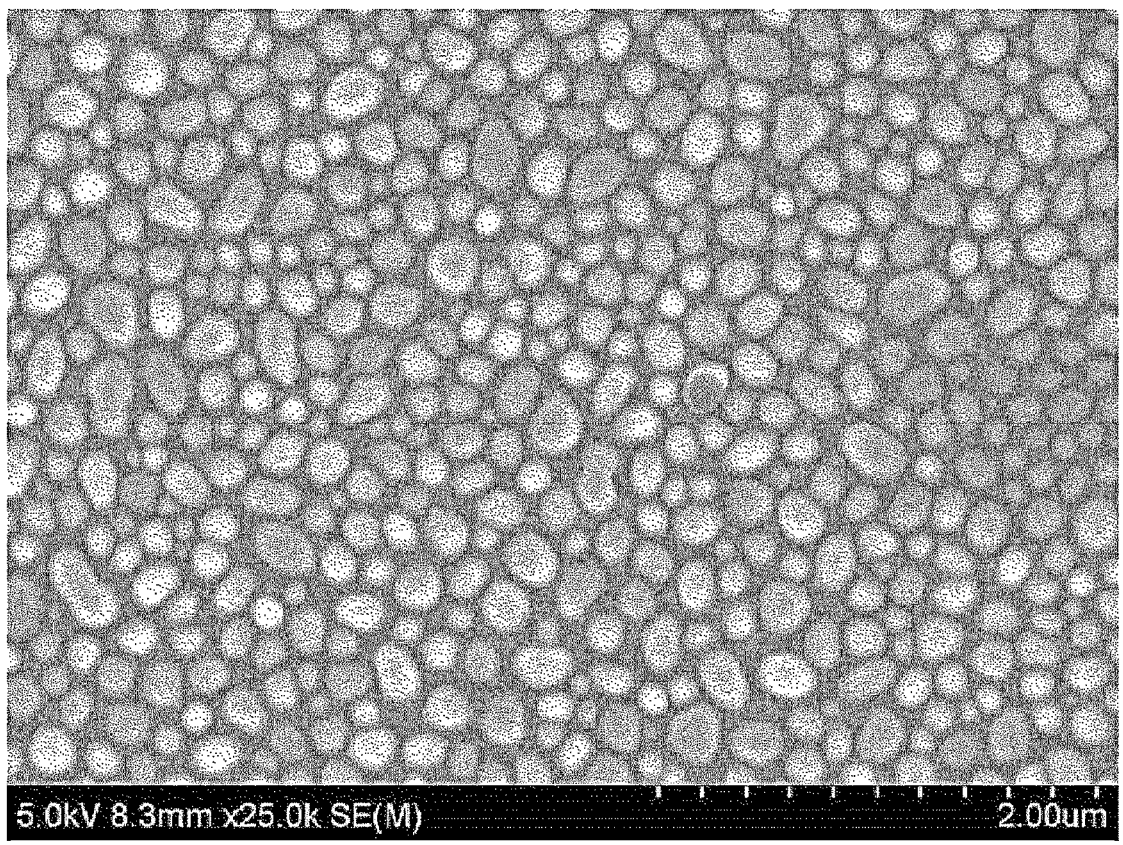

[FIG. 22]
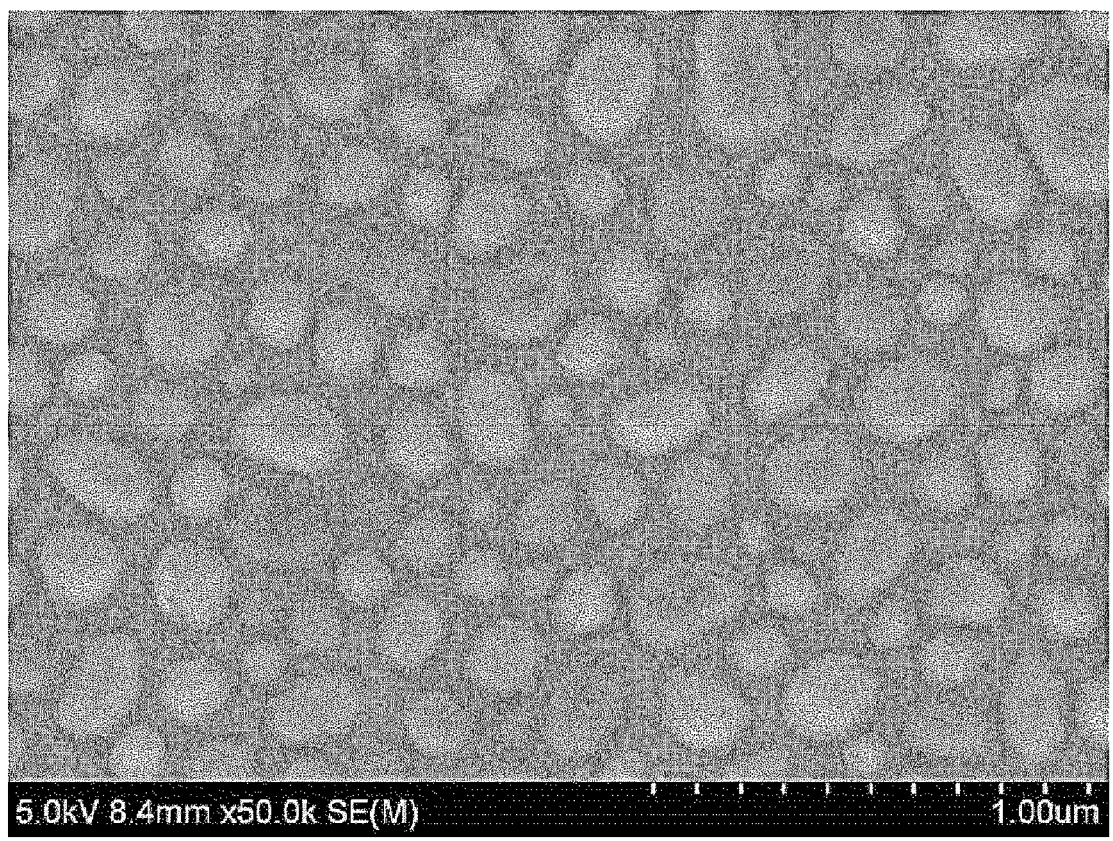

[FIG. 23]
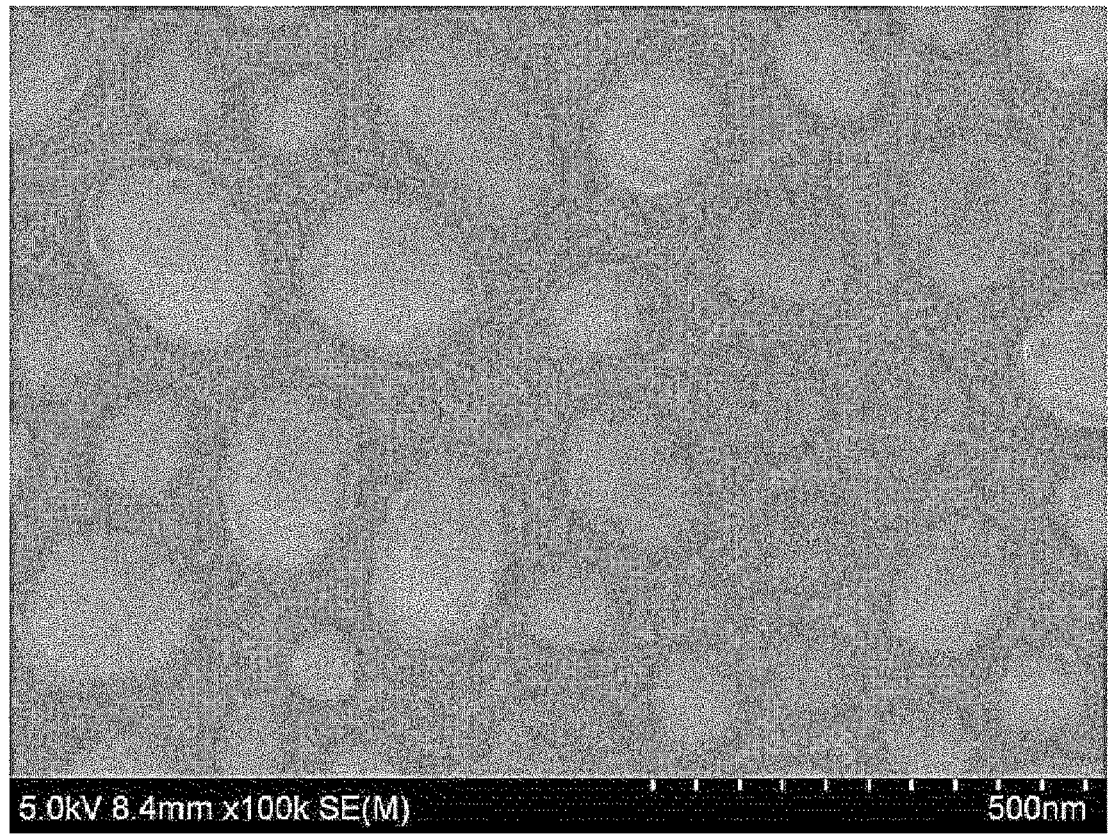

[FIG. 24]
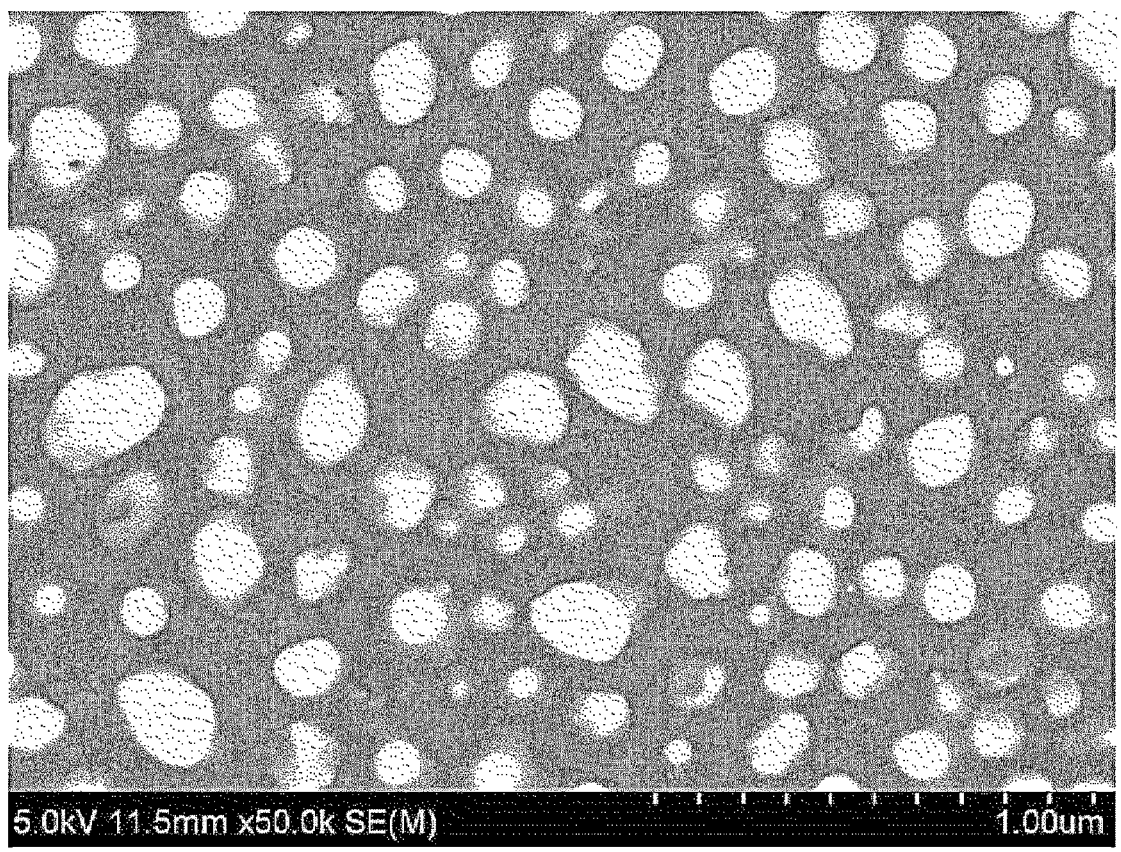

[FIG. 25]
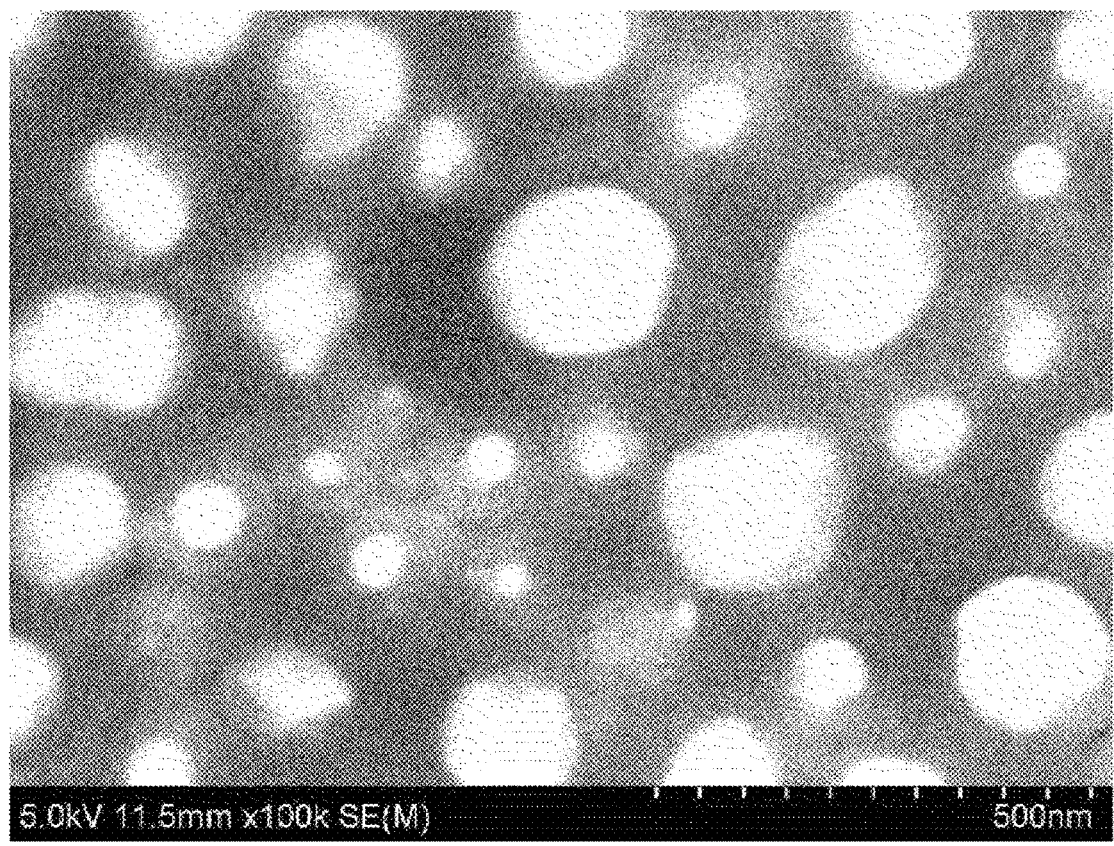
[FIG. 26]
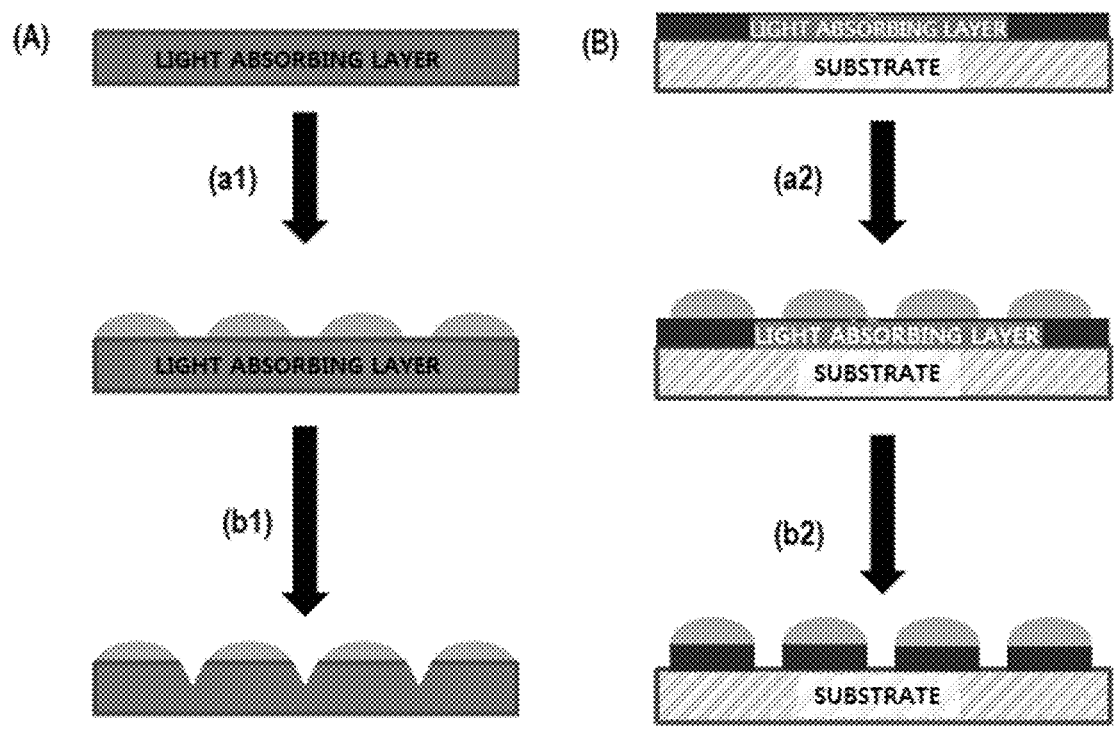

[FIG. 27]
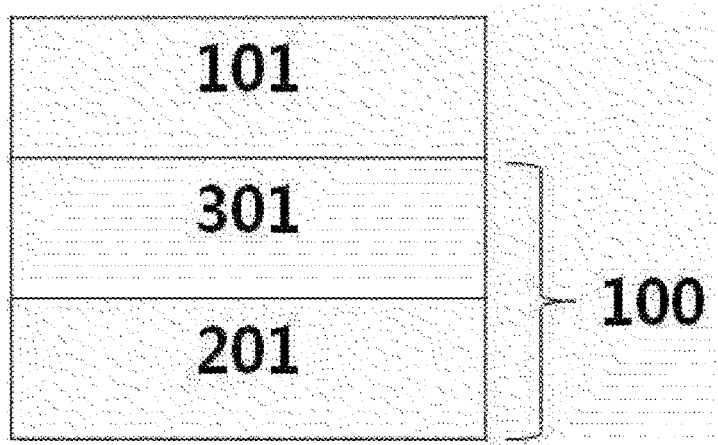
[FIG. 28]
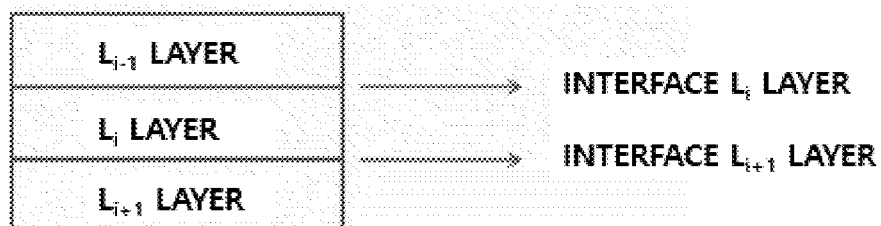
[FIG. 29]
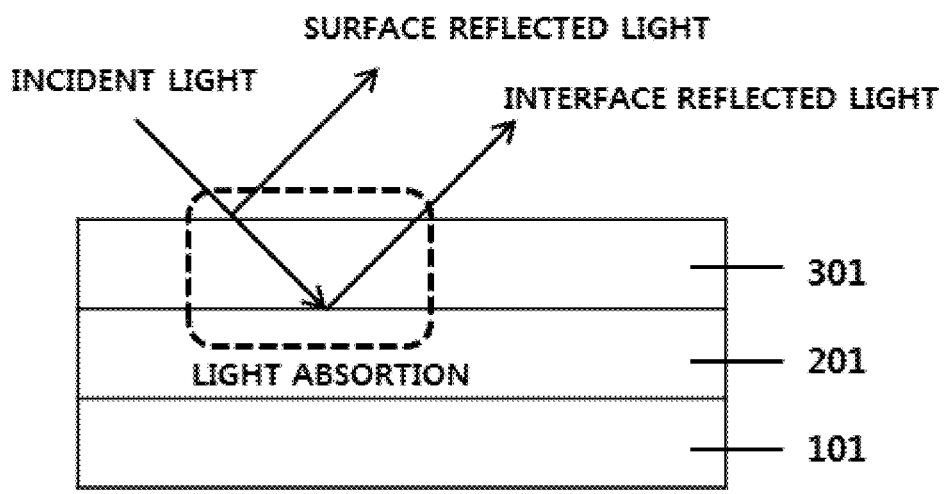

[FIG. 30]
(a) Observing Direction
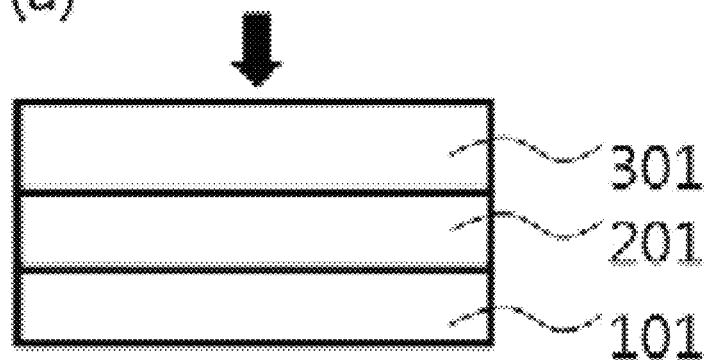
(b) Observing Direction
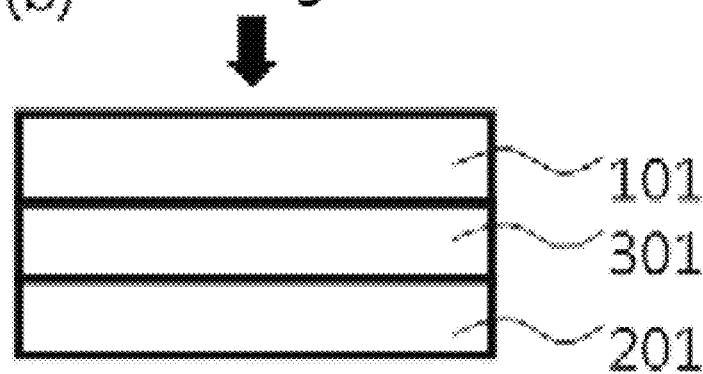

[FIG. 31]
(a) Observing Direction
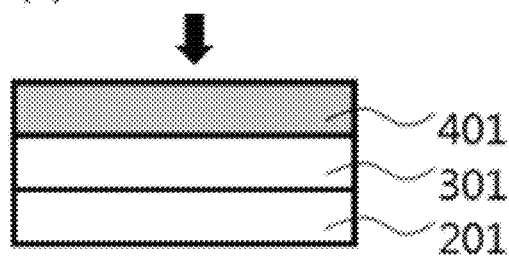
(b) Observing Direction
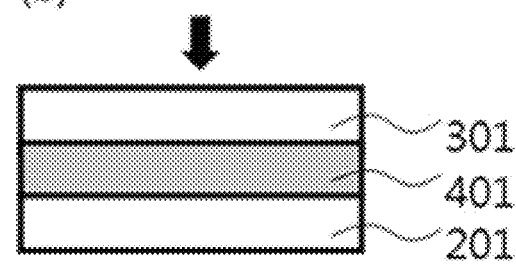
(c) Observing Direction
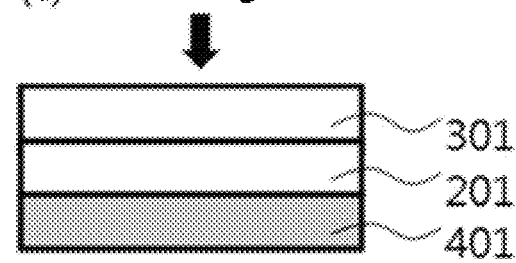

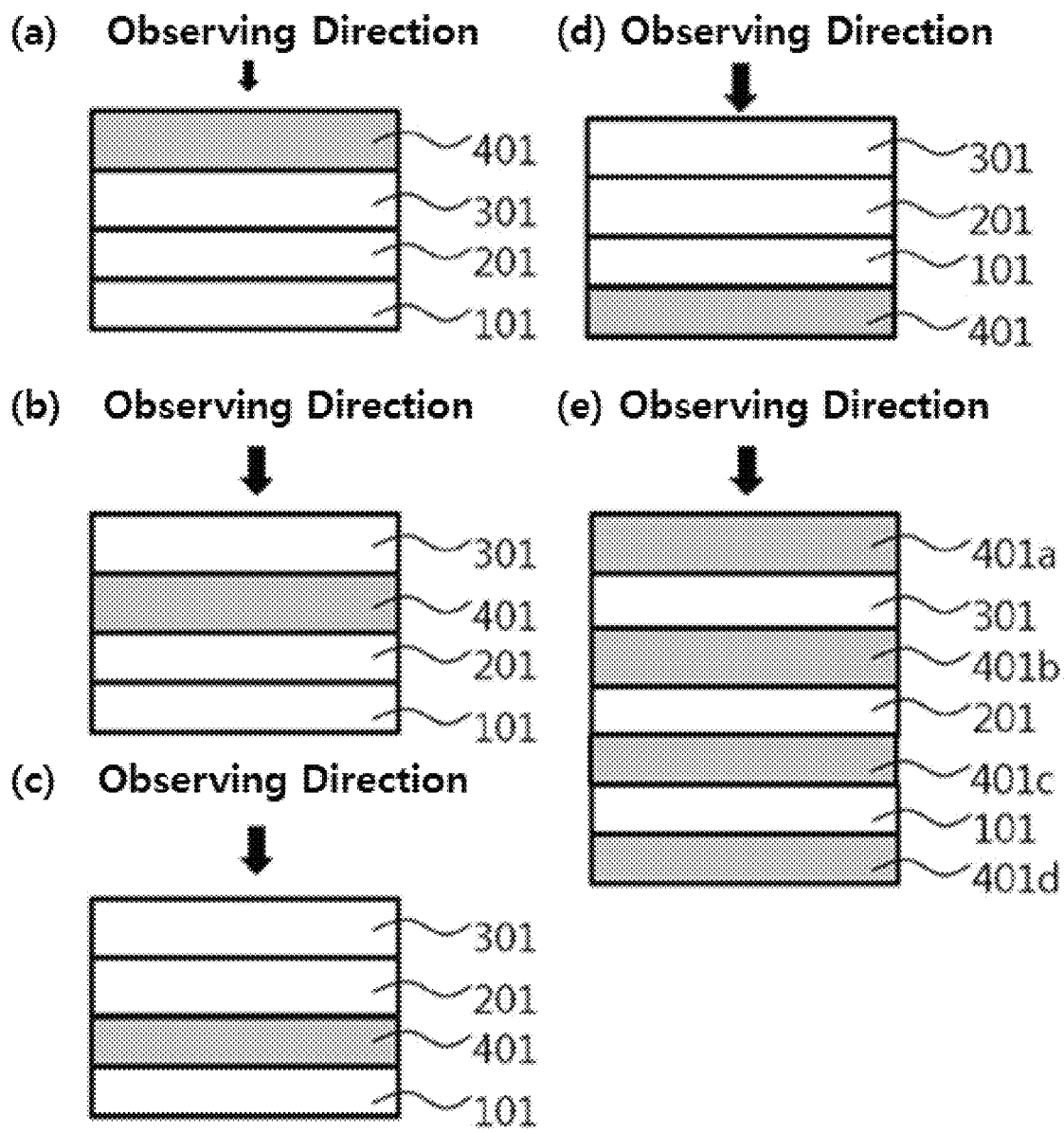
[FIG. 32]

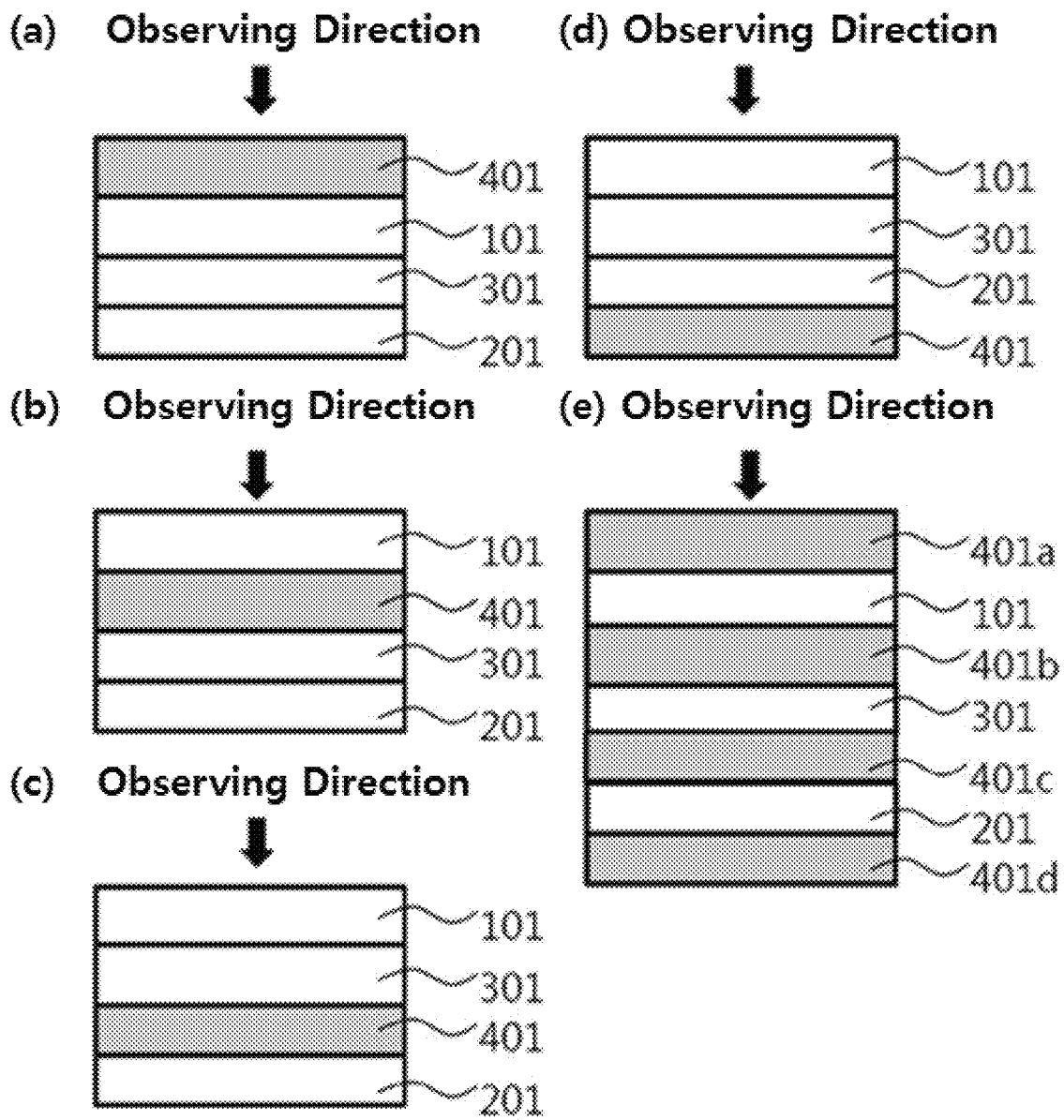
[FIG. 33]

[FIG. 34]
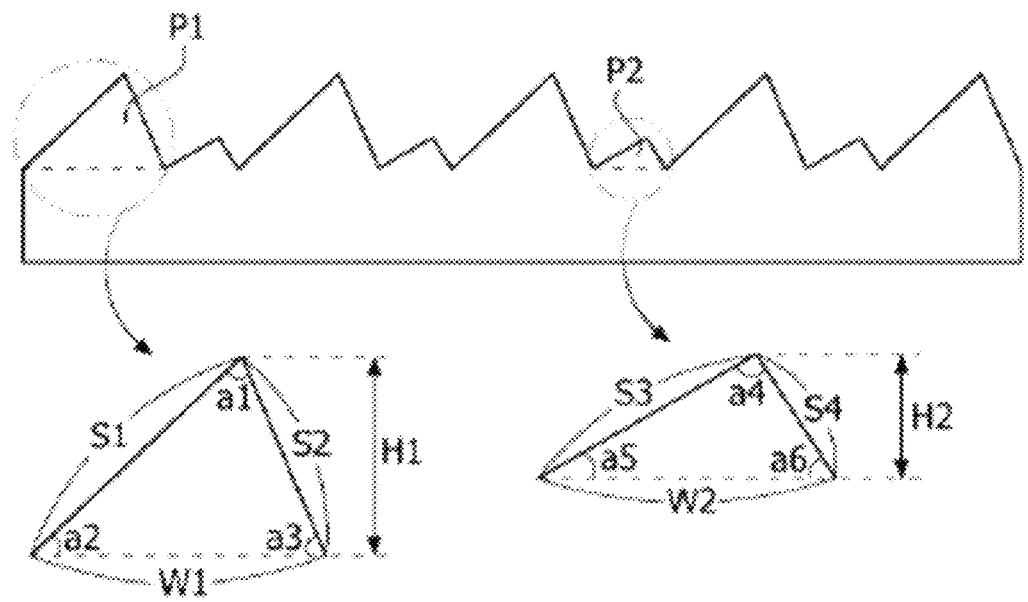
[FIG. 35]
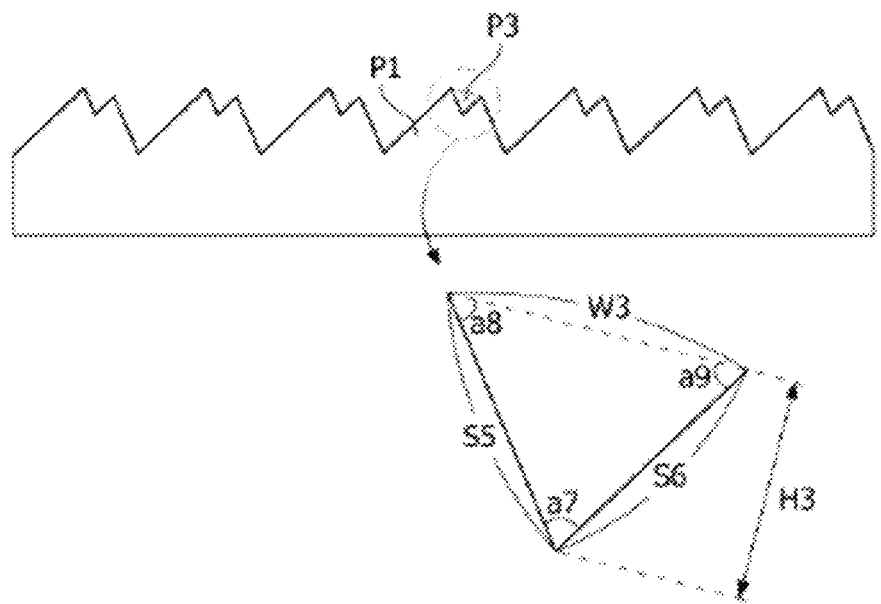

[FIG. 36]
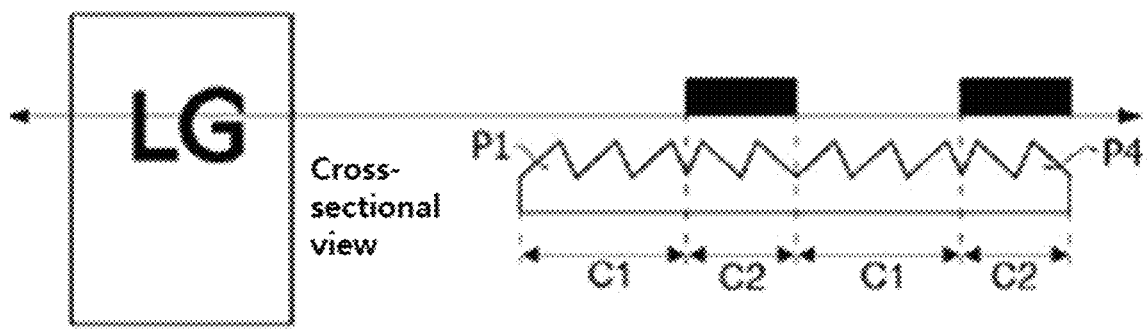
(a)
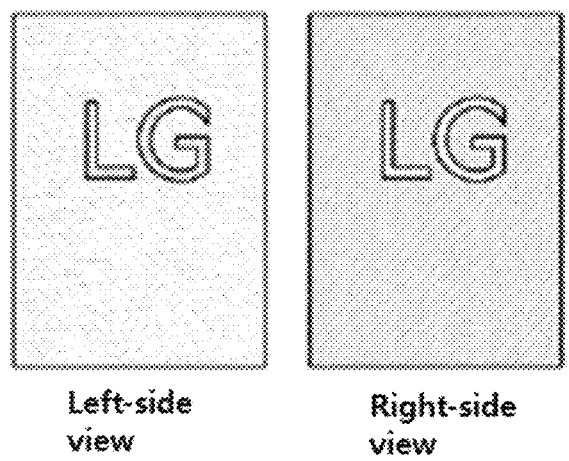
(b)

[FIG. 37]
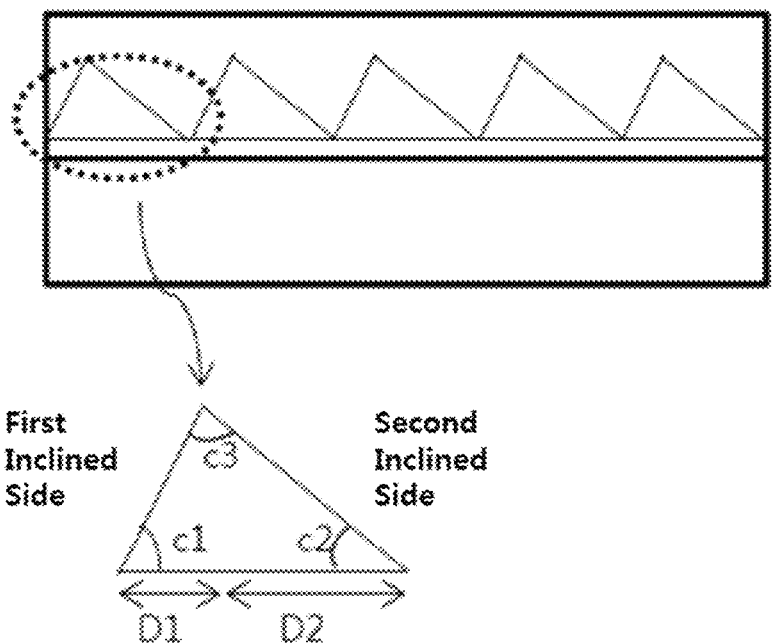
[FIG. 38]
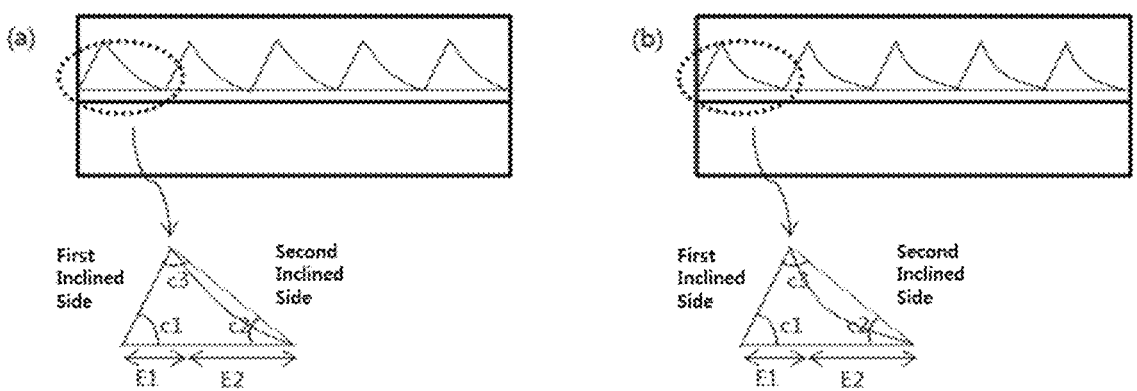

[FIG. 39]
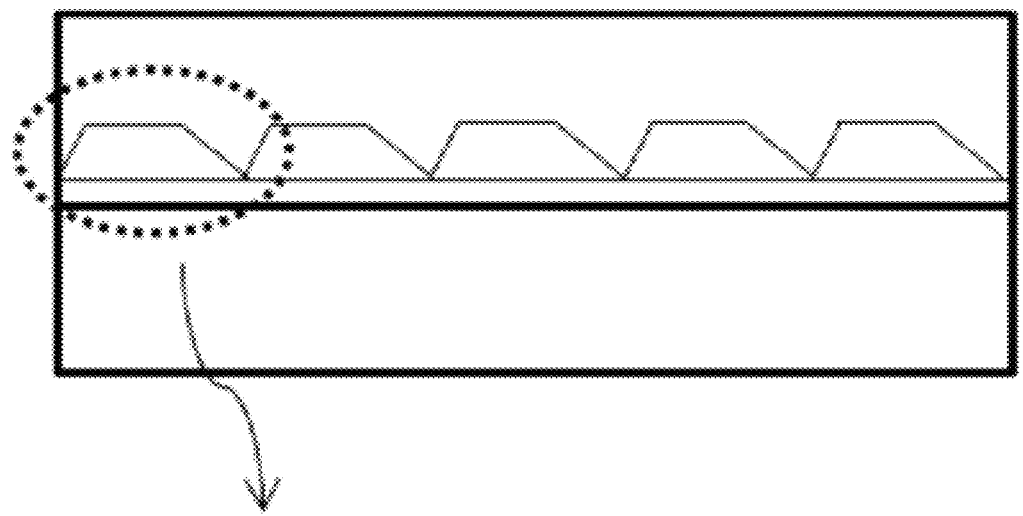
[FIG. 40]
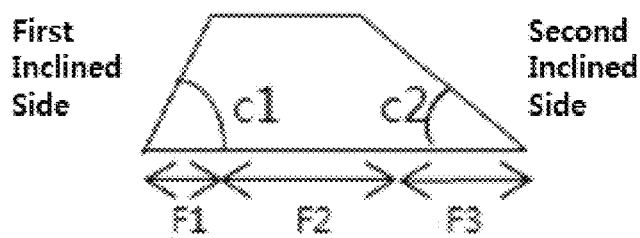
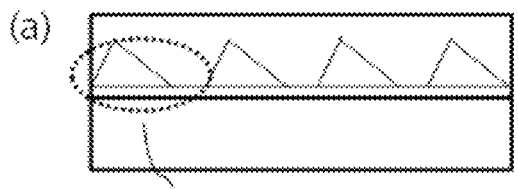
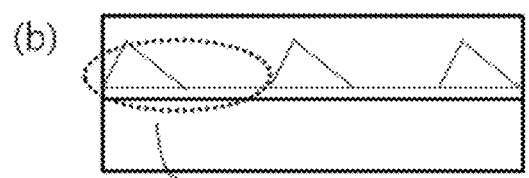
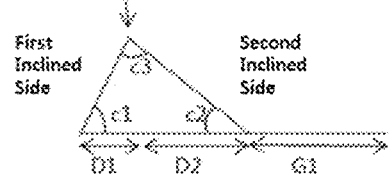
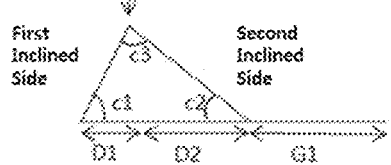

[FIG. 41]
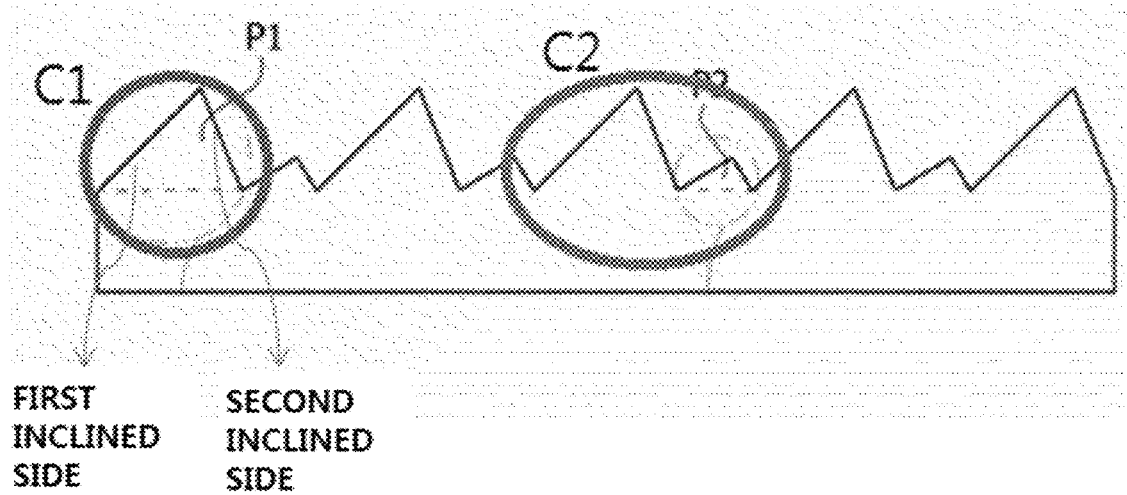
FIRST INCLINED SIDE
SECOND INCLINED SIDE
[FIG. 42]
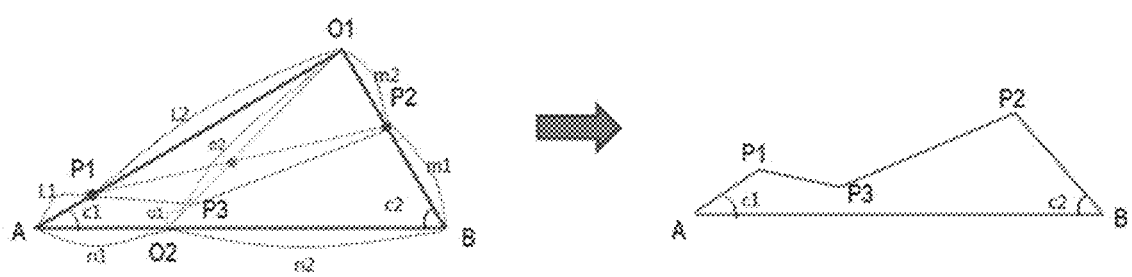
[FIG. 43]
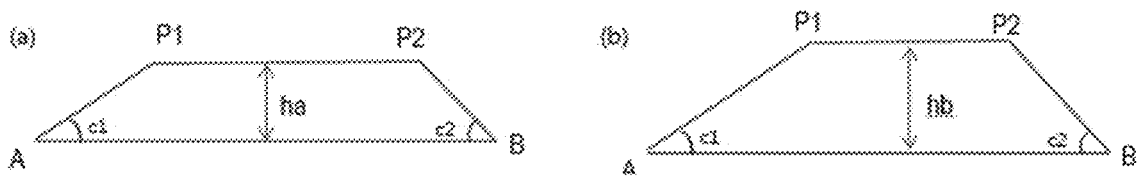
[FIG. 44]
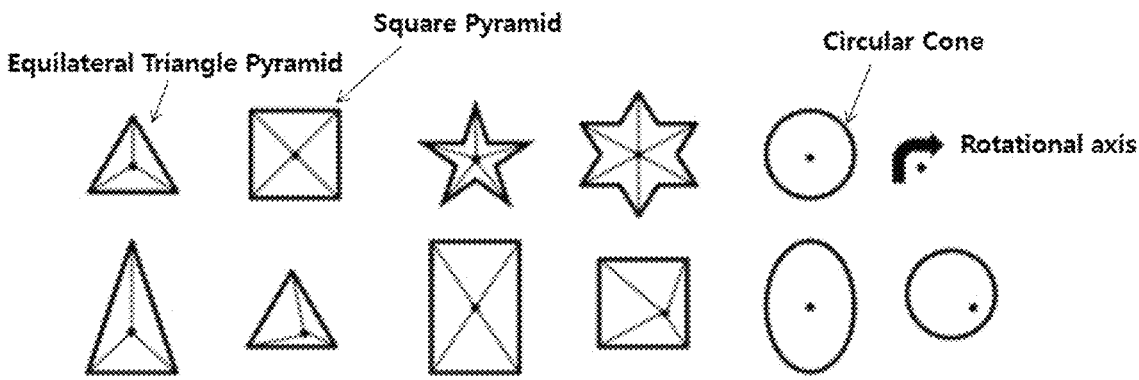

[FIG. 45]
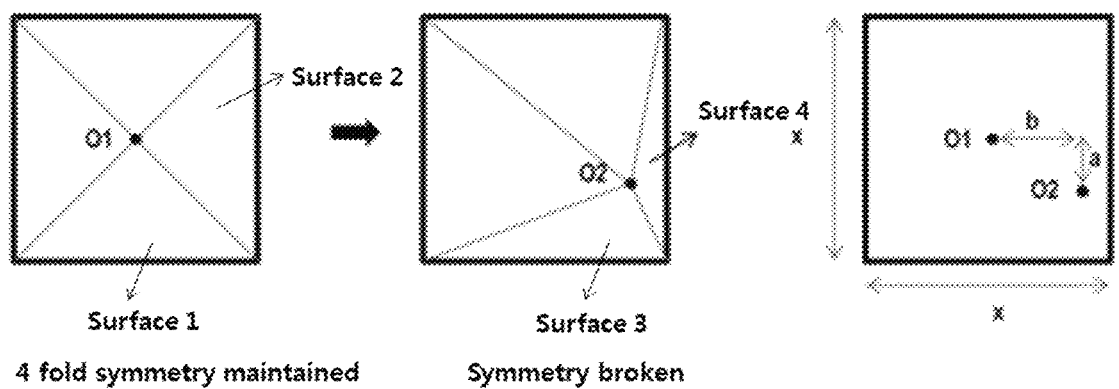
[FIG. 46]
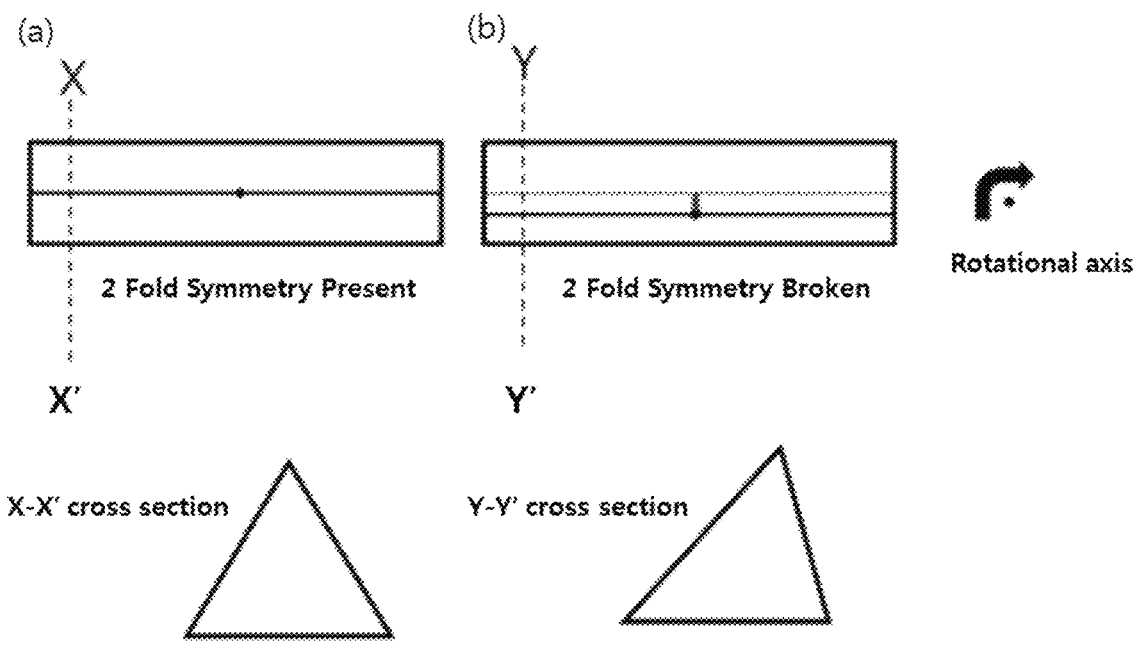

【FIG. 47】
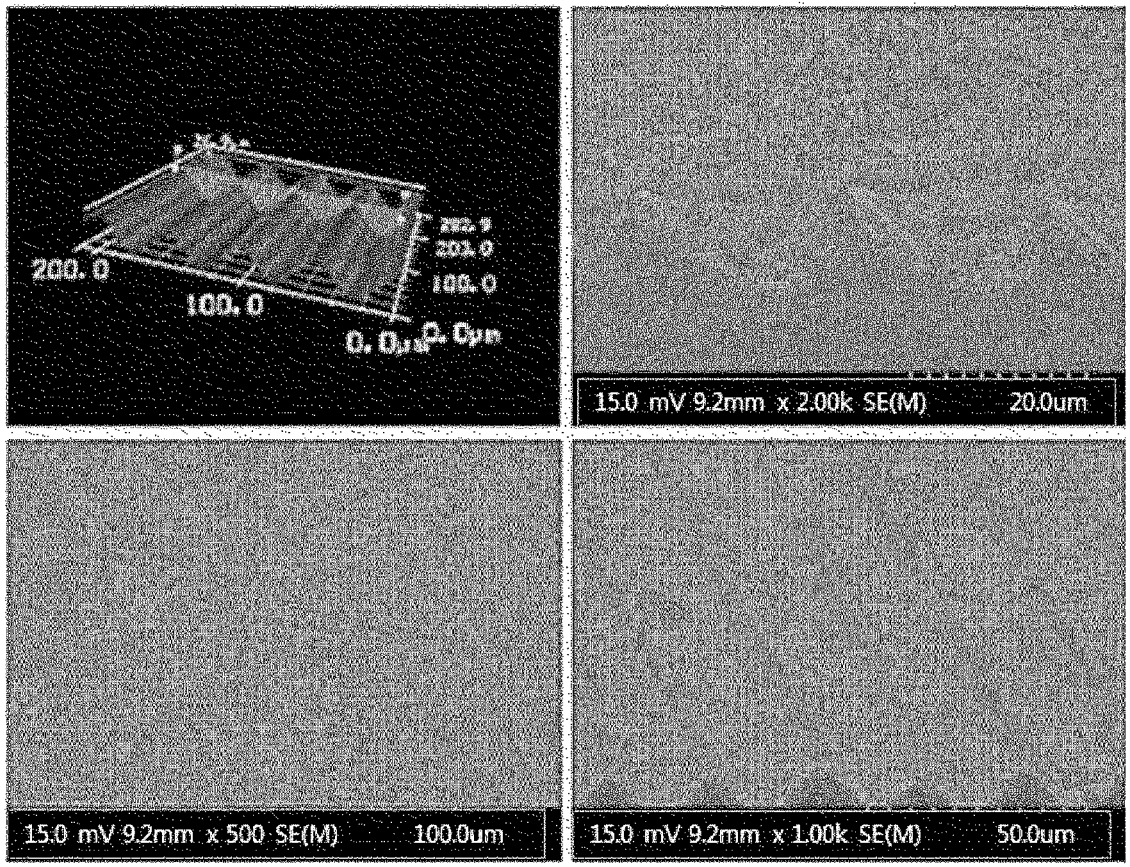
【FIG. 48】
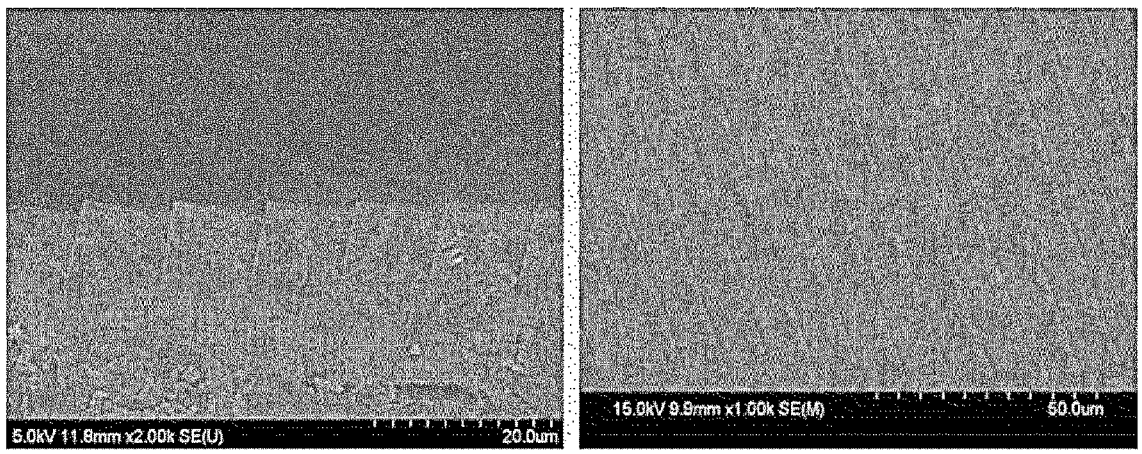

[FIG. 49]
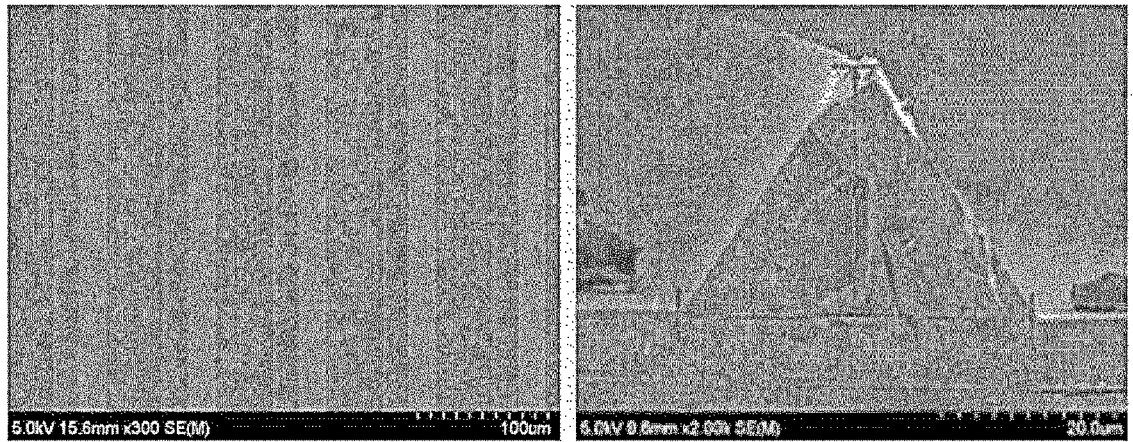
[FIG. 50]
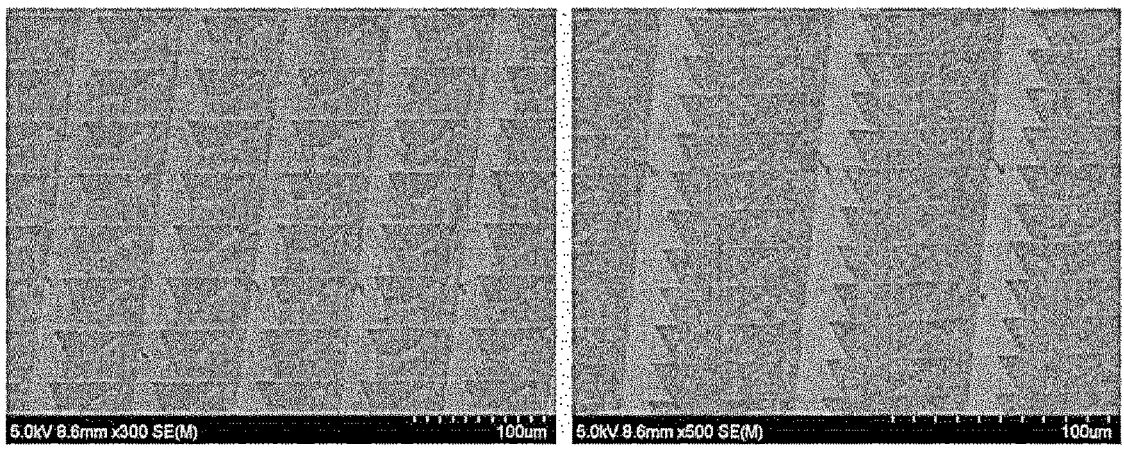

[FIG. 51]
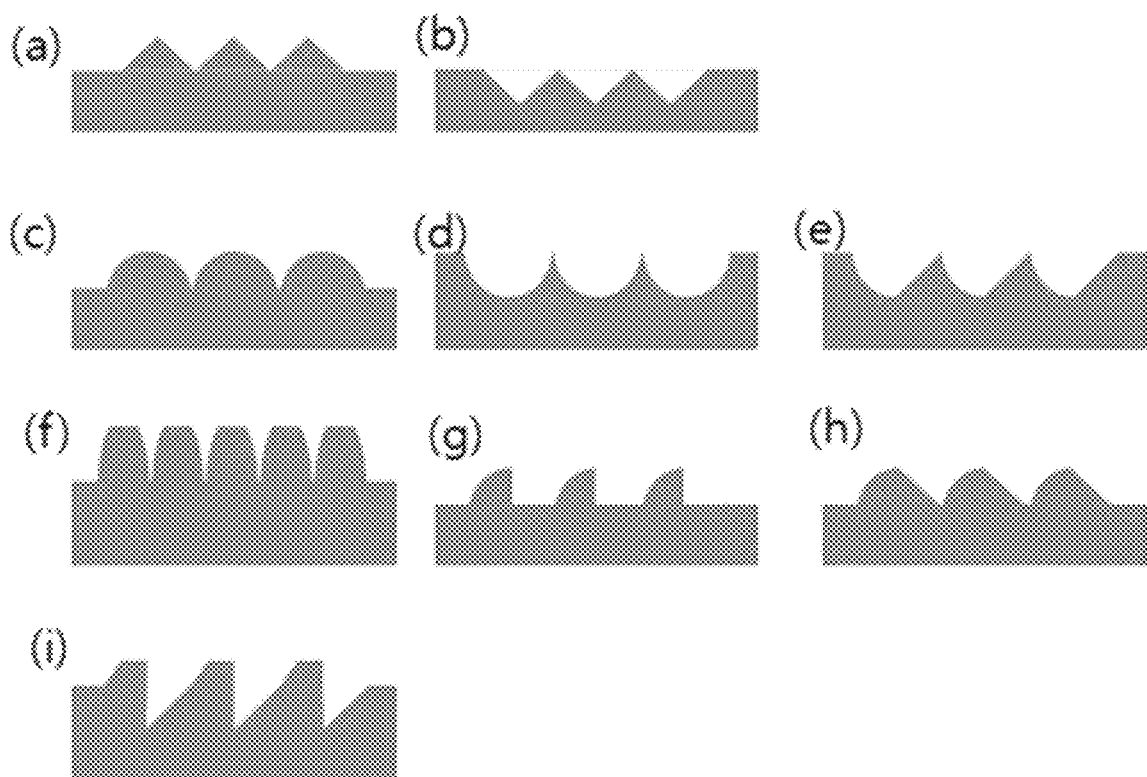

ions need to be reflected in the appearance design (color, shape and the like) as well as enhancing an original function of the product. For various products such as cosmetic name plates or mobile phone cases, the appearances are decorated by attaching a decoration film capable of obtaining various colors and textures. Design factors (colors, color senses, textures and the like) of a decoration film are controlled by a pattern layer, a color layer, a reflective layer, a color film and a color of a printing layer. In addition to such a method, design characteristics of a decoration film may be controlled by patterning a color layer.

METHOD FOR MANUFACTURING FILM FOR DECORATION ELEMENT

This application is a National Phase entry pursuant to 35 U.S.C. § 371 of International Application No. PCT/KR2019/011259 filed on Sep. 2, 2019, and claims priority to and the benefits of Korean Patent Application No. 10-2018-0103951, filed with the Korean Intellectual Property Office on Aug. 31, 2018, and Korean Patent Application No. 10-2018-0103960, filed with the Korean Intellectual Property Office on Aug. 31, 2018, the entire contents of which are incorporated herein by reference.

TECHNICAL FIELD

The present disclosure relates to a method for manufacturing a film for a decoration element.

BACKGROUND ART

In order to increase a value of a product, various customer opinions need to be reflected in the appearance design (color, shape and the like) as well as enhancing an original function of the product. For various products such as cosmetic name plates or mobile phone cases, the appearances are decorated by attaching a decoration film capable of obtaining various colors and textures. Design factors (colors, color senses, textures and the like) of a decoration film are controlled by a pattern layer, a color layer, a reflective layer, a color film and a color of a printing layer. In addition to such a method, design characteristics of a decoration film may be controlled by patterning a color layer.

In a general patterning process, an area of a photoresist/film exposed during an exposure process is assigned using a mask, and through a subsequent etching process, the photoresist/film is patterned. The size, the shape and the like of the pattern are eventually determined by the size and the shape of the mask. As a non-traditional patterning process, a method of thinly depositing a metal thin film, and, after converting the metal thin film to an island shape through heat treatment, using the metal thin film as a mask is sometimes used. This is converting to a stable island shape using instability of a thin film and a heat treatment process, and, since an additional heat treatment process is required, has disadvantages in that the method is difficult to use on a plastic substrate vulnerable to heat.

DISCLOSURE

Technical Problem

The present disclosure relates to a method for manufacturing a film for a decoration element.

Technical Solution

One embodiment of the present disclosure provides a method for manufacturing a film for a decoration element, the method including depositing two or more islands on one surface of a film; and forming a pattern portion by dry etching the film using the island as a mask.

Advantageous Effects

According to a method for manufacturing a film for a decoration element according to the present disclosure, an island mask can be formed without a separate heat treatment process.

In addition, according to a method for manufacturing a film for a decoration element according to the present disclosure, the film can be readily etched without a separate mask using the island as a mask.

In addition, according to a method for manufacturing a film for a decoration element according to the present disclosure, the film can be etched without damaging the film or a substrate caused by heat treatment.

In addition, according to a method for manufacturing a film for a decoration element according to the present disclosure, a high resistance decoration element can be manufactured by readily etching a low resistance film or light absorbing layer.

DESCRIPTION OF DRAWINGS

FIG. 1 and FIG. 26 are diagrams each illustrating a method for manufacturing a film for a decoration element of the present disclosure.

FIGS. 2 to 4 show a test on reactivity of a film for an etching gas.

FIGS. 5 to 7 show a surface of a film before and after etching processes of Examples 1 to 3.

FIGS. 8 to 11 are diagrams showing deposited indium island mask shapes of reference examples.

FIG. 12 and FIG. 13 are diagrams showing a surface of a film before and after an etching process of Example 4.

FIG. 14 and FIG. 15 are diagrams showing a surface of a film before and after an etching process of Reference Example 3.

FIG. 16 to FIG. 25 show SEM images of a light reflective layer side of a decoration element manufactured in each of examples and comparative examples.

FIG. 27 to FIG. 33 each illustrate a laminated structure of a decoration element of the present disclosure.

FIG. 34 to FIG. 51 each illustrate a shape of a pattern layer that may be included in a film for a decoration element of the present disclosure.

MODE FOR DISCLOSURE

In the present specification, "of" represents, unless defined otherwise, a case of selectively or all including those listed, that is, a meaning of "and/of".

In the present specification, a "layer" means covering 70% or more of an area where the corresponding layer is present. It means covering preferably 75% or more, and more preferably 80% or more.

In the present specification, a "thickness" of a certain layer means a shortest distance from a lower surface to an upper surface of the corresponding layer.

In the present specification, spatially relative terms "one surface" and "the other surface" may be used to readily describe a correlation between one constituent and other constituents as illustrated in the drawings. Spatially relative terms need to be understood as terms including different directions of constituents when used or operated in addition to the direction illustrated in the drawings. For example, when flipping a constituent illustrated in the drawing, a constituent described as "one surface" of another constituent may be placed on "the other surface" of another constituent. Accordingly, an exemplary term "one surface" may include both directions down and up. The constituent may be oriented in other directions as well, and accordingly, spatially relative terms may be interpreted depending on orientation.

One embodiment of the present disclosure provides a method for manufacturing a film for a decoration element, the method including depositing two or more islands on one surface of a film; and forming a pattern portion by dry etching the film using the island as a mask.

FIG. 1 illustrates the method for manufacturing a film for a decoration element.

According to FIG. 1 (A), the method for manufacturing a film for a decoration element of the present specification includes (a) depositing two or more islands on a film and (b) forming a pattern portion by dry etching the film using the island as a mask.

According to FIG. 1 (B), the film may include a separate substrate on the other surface.

The forming of a pattern portion by dry etching the film is forming a pattern portion on the film by etching the film. The etched portion of the film may be referred to as a concave portion, and the portion of the film not etched may be referred to as a convex portion.

The island functions as a mask when etching the film so that only a part of the film is etched. Herein, by adjusting a size or distribution of the island, the degree of etching of the film may be controlled. Specifically, a width, a height, a horizontal cross-section or a vertical cross-section of the island may be adjusted as follows.

The island has a width of 10 nm to 1,000 nm and a height of 3.3 nm to 1,000 nm; preferably has a width of 20 nm to 800 nm and a height of 10 nm to 600 nm; and more preferably has a width of 50 nm to 600 nm and a height of 10 nm to 200 nm.

The island may have a horizontal cross-section of 800,000 $nm^2$ or less, greater than or equal to 80 $nm^2$ and less than or equal to 800,000 $nm^2$, preferably greater than or equal to 300 $nm^2$ and less than or equal to 500,000 $nm^2$, and more preferably greater than or equal to 1,000 $nm^2$ and less than or equal to 300,000 $nm^2$. The "horizontal cross-section" may mean an area of a cross-section obtained by cutting the island in a direction horizontal to a surface direction of the film.

The island may have a vertical cross-section of 800,000 $nm^2$ or less, greater than or equal to 100 $nm^2$ and less than or equal to 800,000 $nm^2$, preferably greater than or equal to 200 $nm^2$ and less than or equal to 600,000 $nm^2$, and more preferably greater than or equal to 300 $nm^2$ and less than or equal to 300,000 $nm^2$. The "vertical cross-section" may mean an area of a cross-section obtained by cutting the island in a direction vertical to a surface direction of the film.

When the horizontal cross-section or the vertical cross-section of the island satisfies the above-mentioned numerical range, shape and distribution of the mask island may be readily controlled, and it is effective in that the etching level of the film to etch is controllable. In addition, when satisfying the above-mentioned numerical range, the island is deposited in a separated island shape instead of a film shape in which the islands are connected to each other, and each of the deposited islands may maintain a separated form without being connected to each other.

The width and the height of the island, the horizontal cross-section of the island, and the vertical cross-section of the island may be measured using methods generally used in the art. For example, an atomic force microscope (AFM), a scanning electron microscope (SEM), a transmission electron microscope (TEM) and the like may be used in the measurement.

The island includes indium (In). Specifically, the indium (In) of the island may have an atomic percent (at %) of 99% or greater. When using indium as a material of the island, deposition in an island shape is obtained without further heat treatment, and each of the islands may maintain a separated form without being connected to each other.

Specifically, in order to deposit a specific material in an island shape in the art, the deposition needs to be conducted under a high temperature environment, or the deposition is conducted in a continuous film form, and by heating treating the result at a high temperature, the film form needs to be converted to an island shape using a dewetting phenomenon occurring in the film. For example, in order to deposit germanium (Ge, Tm=938.2° C.) and silicon (Si, Tm=1414° C.) in an island shape, the deposition needs to be conducted under a high temperature deposition environment of 750° C. or higher. In addition, aluminum is prepared in an island shape using a dewetting phenomenon by heat treating at a high temperature of 600° C. or higher since aluminum is deposited in a continuous film form under a general deposition environment. However, a problem of damaging a plastic substrate vulnerable to heat occurs when deposited to an island shape through the high temperature deposition environment and the high temperature heat treatment method.

In the present disclosure, by using indium (In) as an island material, indium deposited under a room temperature deposition environment without further heat treatment is able to be formed in an island shape. Indium has a melting point of 156.6° C., which is lower than melting points of other materials (Al: 660° C., Cu: 1084.6° C., Ag: 961.8° C.), and has an advantage in that welding at a low temperature (cold welding) is possible. In other words, when the island is indium, there is an advantage in that the island is readily formed under a room temperature deposition environment.

The depositing of islands may be conducted under a temperature condition of 10° C. to 100° C., preferably higher than or equal to 10° C. and lower than or equal to 80° C., and more preferably higher than or equal to 10° C. and lower than or equal to 60° C. When depositing at a temperature lower than the above-mentioned range, adhesion to a film of materials coming off a target and reaching the film decreases causing a problem of the deposited film being separated from the film in a subsequent process, and at a temperature higher than the above-mentioned range, there may be problems in that particles coming off a target have high mobility when reaching a film connecting island shapes instead of the island shapes being separated, and at an even higher temperature, there may be problems in that materials deposited to a film re-vaporize or re-evaporate decreasing a growth rate of an island.

The depositing of two or more islands on a film may use an evaporation method or a sputtering method. The evaporation method is depositing on an adherend by vaporizing or subliming a target material using an electron beam or an electric filament inside a high vacuum ($5 \times 10^{-5}$ Torr to $1 \times 10^{-7}$ Torr) chamber. In addition, the sputtering method is a method of flowing a gas such as argon into a vacuum chamber, and depositing a target material on an adherend by plasma generated by applying a voltage.

The evaporation method may be conducted under a deposition rate condition of 0.1 nm/sec to 10 nm/sec after applying a voltage or increasing electric power of an electric beam on a target material such as indium (In) located in tungsten (W) or molybdenum (Mo)—including deposition boat (evaporation boat) and crucible under a high vacuum state ($5 \times 10^{-5}$ Torr to $1 \times 10^{-7}$ Torr) until vaporization or sublimation occurs.

The process condition of the sputtering method may satisfy a specific condition in order to accomplish the width, the height, the vertical cross-section and the horizontal cross-section of the island described above. Particularly, different conditions such as applied electric power may be adjusted to be different depending on the distance between a film that is an adherend, and a sputter target.

In the sputtering method, a shortest distance (d1) between the film and the sputter target is 200 mm or less, and electric power is applied for 10 seconds to 1,000 seconds under an electric power condition of 0.1 W/cm² to 10 W/cm² applied per a unit area of the target; and preferably a shortest distance (d1) between the film and the sputter target is 200 mm or less, and electric power of 0.1 W/cm² to 5 W/cm² is applied for 10 seconds to 900 seconds. The denominator unit cm² of the electric power condition means that the unit area of the sputter target is 1 cm². In addition, a shortest distance (d1) between the film and the sputter target may be greater than or equal to 10 mm and less than or equal to 150 mm, and preferably greater than or equal to 50 mm and less than or equal to 120 mm.

Alternatively, in the sputtering method, a shortest distance (d2) between the film and the sputter target is greater than 200 mm, and electric power is applied for 10 seconds to 1,200 seconds under an electric power condition of 1 W/cm² to 10 W/cm² applied per a unit area of the target, or electric power of 0.1 W/cm² to 10 W/cm² is applied for 10 seconds to 1,000 seconds, or preferably electric power of 0.1 W/cm² to 5 W/cm² is applied for 10 seconds to 900 seconds. In addition, a shortest distance (d2) between the film and the sputter target may be greater than or equal to 250 mm and less than or equal to 1,000 mm, and preferably greater than or equal to 300 mm and less than or equal to 900 mm.

In the sputtering method, a process pressure during sputtering may be from 1 mTorr to 100 mTorr, preferably 1 mTorr to 75 mTorr, and more preferably 1 mTorr to 50 mTorr. When the process pressure is higher than the above-mentioned range, the number of plasma gas particles present inside the chamber increases, and particles emitted from the target collide with plasma gas particles losing energy, which decreases an island growth rate. On the other hand, when the process pressure is kept too low, energy loss of island component particles caused by plasma gas particles decreases, however, there is a disadvantage of damaging a film or a substrate by particles having high energy. Therefore, as the sputtering process condition, an optimal process condition needs to be found by adjusting various variables such as a size of deposition equipment, a sample position and a target distance, a target type and a gas type, a flow rate, a pressure during the process, and the like.

The sputtering method may use argon (Ar), helium (He) or nitrogen ($N_2$) as a sputter gas.

In the sputtering method, the target may be used differently depending on the material of an island to deposit on a film. For example, when the island is indium (In), the target may be Indium target (purity 99.99%) manufactured by RND Korea Corp.

The method for manufacturing a film for a decoration element of the present disclosure includes forming a pattern portion by dry etching the film using the island as a mask.

The "dry etching" may be dry etching using plasma. The "plasma" means an ionized gas, and when discharging a gas formed with atoms and molecules using energy such as electricity, plasma formed with electrons, ions, decomposed gases, photons and the like is formed. These ions and decomposed gases are used in dry etching using plasma. For example, when decomposing argon (Ar) using electric energy, plasma is formed while producing $Ar^+$ ions and additional electrons, and when discharging a gas such as $CF_4$, ions such as $CF_3^+$ and F, and decomposed gases are generated.

The dry etching is an etching method distinguished from wet etching that has been used in the art, and, as a method of selectively etching a film using reactive gases or ions, is different from a wet etching method etching a film using a solution.

The dry etching is capable of anisotropic etching, and the wet etching has properties of isotropic etching. An etched area in a film is generally determined by a mask used during a lithography process, and a part covered by the mask is not etched, and a part that is not covered by the mask is selectively etched. In the isotropic etching, an undercut phenomenon in which the part covered by the mask is also partially etched is likely to occur, and when the undercut phenomenon excessively occurs, there is a problem in that a fine pattern is difficult to be formed since an area that is not supposed to be etched is etched.

On the other hand, the dry etching of the present disclosure has properties of anisotropic etching, and has an advantage in that the degree of undercut occurrences is smaller than wet etching. This has an advantage in that a fine pattern is readily formed.

In addition thereto, the dry etching conducts etching using only a small amount of gas, which reduces process costs, and has an advantage of causing less environmental contamination since a solution that has possibility of environmental contamination is not used.

In addition, changes in the plasma properties generated during an etching process may be readily monitored, and therefore, stability for the process may be readily decided, and the timing of the end of the etching process may also be readily determined, which is advantageous for process automation.

Particularly, when an island mask is small with a width being from 10 nm to 1,000 nm and a distance between the islands being 100 nm or less as in the present disclosure, dry etching that may conduct anisotropic etching is advantageous in order to effectively form a fine pattern.

The dry etching may be a method of capacity coupled plasma (CCP) etching, reactive ion etching (RIE), inductively coupled plasma (ICP) etching, electron cyclotron resonance (ECR) plasma etching or microwave etching.

The dry etching may be conducted by introducing the film into a chamber, supplying an etching gas at a flow rate of 5 sccm to 100 sccm, and applying electric power of 50 W to 1,000 W under a pressure condition of 0.5 mTorr to 100 mTorr or less.

The pressure condition is preferably greater than or equal to 1 mTorr and less than or equal to 90 mTorr, and more preferably greater than or equal to 1 mTorr and less than or equal to 80 mTorr. When satisfying the above-mentioned numerical range, there is an advantage of forming stable plasma.

The etching gas has a flow rate of 10 sccm to 80 sccm, and preferably 10 sccm to 50 sccm.

The electric power may vary depending on the type of etching equipment.

Specifically, when the etching equipment is RIE equipment, the counter electrode side maintains a ground state, and electric power applied to the substrate electrode side may be from 10 W to 500 W.

In addition, when the etching equipment is RIE-ICP equipment, electric power applied to the substrate electrode side on which a sample to etch is placed may be from 10 W to 500 W, and electric power applied to the ICP side may be from 100 W to 1,000 W.

When the etching equipment is RIE-ICP equipment, electric power applied to the substrate electrode side may be from 10 W to 400 W, and preferably 10 W to 300 W.

In addition, when the etching equipment is RIE-ICP equipment, electric power applied to the ICP side may be from 200 W to 1,000 W, and preferably from 300 W to 1,000 W.

The etching may be each independently injected into a chamber, or may be formed to a mixed gas in advance and then injected into a chamber. The total flow rate of the etching gas injected into the chamber may be properly selected considering a volume of the reaction chamber, a pressure condition to describe below depending on the performance of other constitutions, and the like.

The etching gas further includes one, two or more selected from the group consisting of a halogen element-containing gas, an oxidizing gas ($O_2$), nitrogen gas ($N_2$), hydrogen gas ($H_2$), a hydrocarbon gas and an inert gas.

The halogen element-containing gas is $Cl_2$, $CCl_4$, $CCl_2F_2$, $CF_4$, $BCl_3$, $NF_3$, $NF_5$, $SF_6$, $F_2$, $C_2F_6$, $C_3F_8$, $C_4H_8$ or $CHF_3$.

The oxidizing gas is $O_2$, $O_3$, $CO$, $CO_2$, $COCl_2$, $COF_2$ or $NO_2$.

The inert gas is argon gas (Ar), xenon gas (Xe), krypton gas (Kr) or helium gas (He).

The hydrocarbon gas may be a hydrocarbon gas having 1 to 9 carbon atoms, and examples thereof may include methane ($CH_4$) gas.

The etching gas may be selected depending on the type of the film to etch. For example, when the film is a metal such as aluminum (Al), the etching gas includes a halogen element-containing gas such as $BCl_3$, $CCl_4$, $CF_4$ or $Cl_2$, and when the film is an organic material, the etching gas includes a halogen element-containing gas such as $CF_4$, or oxygen gas, and when the film is a semiconductor material such as GaAs, InP, HgCdTe or ZnS, the etching gas includes a halogen element-containing gas, hydrogen gas or a hydrocarbon gas, and when the film is an inorganic material such as Si, $SiO_2$ or $Si_3N_4$, the etching gas may be a halogen element-containing gas.

The dry etching may be conducted for longer than or equal to 60 seconds and shorter than or equal to 600 seconds, preferably for longer than or equal to 80 seconds and shorter than or equal to 500 seconds, and more preferably for longer than or equal to 100 seconds and shorter than or equal to 300 seconds. When satisfying the above-mentioned numerical range, etching effects increase, and a difference between the portion other than the area where an island mask is formed and the area where an island mask is formed may be clearly revealed in the film.

The type of the film may be adjusted differently depending on applications and properties of the film to manufacture, and for example, the film may be a metal; an organic material; or an inorganic material.

The metal may be one, two or more selected from the group consisting of titanium (Ti), tin (Sn), aluminum (Al), nickel (Ni), vanadium (V), tungsten (W), tantalum (Ta), molybdenum (Mo), neodymium (Nd), iron (Fe), chromium (Cr) and cobalt (Co).

The organic material is triacetyl cellulose, a cycloolefin copolymer, poly(methyl methacrylate), polycarbonate, polyethylene, polypropylene, polyvinyl alcohol, diacetyl cellulose, polyacrylate, polyethersulfone, polyetheretherketone, polyphenylsulfone, polyetherimide; polyethylene naphthalate (PEN); polyethylene terephthalate (PET); polyimide (PI); polysulfone (PSF); polyarylate (PAR) and an amorphous fluorine resin.

The inorganic material is one or more selected from the group consisting of nitrides of any one of indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co) and silver (Ag); oxides thereof; oxynitrides thereof; or GaAs, AlAs, AlGaAs, GaP, InP, InAs, InGaAs, InSb, CdSe, CdTe, CdS, ZnSe, ZnS, ZnO, GaN, AlGaN, InAlN, HgCdTe and graphene.

The method for manufacturing a film for a decoration element of the present disclosure may further include, prior to the depositing of two or more islands on a film, preparing a substrate; and forming the film on one surface of the substrate.

The substrate may be a glass substrate or a plastic substrate. As the plastic substrate, a sheet or a film including a cellulose resin such as triacetyl cellulose (TAC) or diacetyl cellulose (DAC); a cycloolefin polymer (COP) such as a norbornene derivative; an acrylic resin such as poly(methyl methacrylate) (PMMA); polycarbonate (PC); polyolefin such as polyethylene (PE) or polypropylene (PP); polyvinyl alcohol (PVA); polyethersulfone (PES); polyetheretherketone (PEEK); polyetherimide (PEI); polyethylene naphthalate (PEN); a polyester such as polyethylene terephthalate (PET); polyimide (PI); polysulfone (PSF); a fluorine resin or the like.

A method of forming the film on one surface of the substrate is not particularly limited, however, the method of forming may vary depending on the type of the film. For example, when the film is a metal or an organic material, deposition such as a sputtering method may be used, and when the film is an organic material, a spin coating method may be used.

The film may have a thickness of 1 nm to 500 nm, preferably 5 nm to 100 nm, and more preferably 5 nm to 50 nm.

In the present disclosure, the film for a decoration element described above may be referred to as a "decoration element".

In addition, one embodiment of the present disclosure provides a method for manufacturing a decoration element, the method including depositing a light reflective layer having a structure of two or more islands separated from each other on one surface of a light absorbing layer; and forming a pattern portion by dry etching the light absorbing layer using the light reflective layer as a mask. In other words, when the film for a decoration element described above is a decoration element, the island-deposited 'film' described above may correspond to a 'light absorbing layer', and the 'island' may correspond to a 'light reflective layer'. This process is shown in FIG. 26.

In the present specification, the light reflective layer means an island remaining without being etched after the dry etching of the light absorbing layer using the island as a mask. In other words, there is an advantage in that the light reflective layer used as a mask is not removed, and may be used as a light reflective layer of a decoration element.

When the film is partially etched, a path through which electrons flow is reduced increasing electric resistance of the film, and when the film is completely etched in a thickness direction, electric resistance of the film or the whole film for a decoration element may be increased by blocking the path through which electrons flow.

Specifically, with respect to prior to the forming of a pattern portion by dry etching the film using the island as a mask, a resistance value of a decoration element may increase after the forming of a pattern portion by dry etching the film using the island as a mask by 2 times or more, 5 times or more, 10 times or more, preferably 100 times or more, and more preferably 800 times or more.

The electric resistance value may be measured using a 2 point probe-type electric resistance measuring equipment (HIOKI Co., Ltd. product name 3244-60, Card Hi-tester), and the sample length during the resistance measurement may be from 1 cm to 10 cm. Herein, since resistance is proportional to the sample length, the same distance is measured from each sample surface, and the result is normalized based on 1 cm.

The method for manufacturing a film for a decoration element of the present disclosure may be used in a general method for manufacturing a decoration element. Particularly, the method may be used for deco films, cases of mobile devices, electronic product cases, or household items requiring a color decoration. In addition, since the light absorbing layer may be prepared to have high resistance, inhibition in the function of electronic devices using the decoration element may be prevented by minimizing electromagnetic transmission and reception disturbances caused by electromagnetic shielding (EMI) properties.

One embodiment of the present disclosure provides a decoration element manufactured using the above-described manufacturing method, the decoration element including a light absorbing layer; and a light reflective layer provided on one surface of the light absorbing layer, wherein the decoration element has line resistance of $10^5 \Omega$ or greater.

The decoration element has line resistance of $10^6 \Omega$ or greater, and preferably $10^7 \Omega$ or greater. When satisfying the above-mentioned numerical range, the decoration element may be used in cases of mobile devices or electronic product cases requiring high resistance, and inhibition in the function of electronic devices using the decoration element may be prevented by minimizing electromagnetic transmission and reception disturbances caused by electromagnetic shielding (EMI) properties.

Specifically, the decoration element may have sheet resistance of preferably 100 ohm/square or greater, preferably 500 ohm/square or greater, preferably 5,000 ohm/square or greater, more preferably 10,000 ohm/square or greater, most preferably 1 gigaohm/square or greater, and more preferably 4 gigaohm/square or greater. The sheet resistance may be measured in accordance with a 4-point probe method using a known sheet resistor. As for the sheet resistance, a resistance value (V/I) is measured by measuring a current (I) and a voltage (V) using 4 probes, and by using an area (unit area, W) of a sample and a distance (L) between electrodes for measuring resistance, sheet resistance is obtained (V/I×W/L), and then, a resistive corrector factor (RCF) is multiplied thereby to calculate as ohm/square, a sheet resistance unit. The resistive corrector factor may be calculated using a sample size, a sample thickness and a temperature at the time of measurement, and may be calculated using the Poisson's equation.

In the present disclosure, colors expressed by the decoration element may be defined by spectral characteristics of a light source, reflectance of an object, and color viewing efficiency of an observer. For objective color expression, colors need to be measured with a standard light source and a standard observer, and the colors are expressed as coordinates of color space. Colors of the decoration element may be expressed by a CIE Lab (L*a*b*) coordinate or a LCh coordinate providing visually uniform color space. L* represents brightness, +a* represents redness, −a* represents greenness, +b* represents yellowness and −b* represents blueness, and C* and h* will be described later. In the color space, a total color difference depending on an observing position may be expressed as $\Delta E = \sqrt{\Delta L^{*2} + \Delta a^{*2} + \Delta b^{*2}}$.

The colors may be measured using a spectrophotometer (CM-2600d, manufactured by Konica Minolta, Inc.), and through the spectrophotometer, reflectance of a sample is obtained as a spectrum and reflectance for each wavelength may be obtained, and from this, a spectral reflectance graph and a converted color coordinate may be obtained. Herein, data are obtained at an 8-degree viewing angle, and, in order to observe dichroism of the decoration element, measurements are made in a horizontal direction and a vertical direction with respect to the decoration element.

The viewing angle is an angle formed by a straight line (d1) in a normal line direction of a surface of a color developing layer surface of the decoration element and a straight line (d2) passing through the spectrophotometer and one point of the decoration element to measure, and generally has a range of 0 degrees to 90 degrees. The "color developing layer" is a term including a light absorbing layer and a light reflective layer.

The color developing layer may provide metallic texture and depth of colors when looking at the decoration element. The color developing layer allows an image of the decoration element to be seen in various colors depending on a viewing angle. This is due to the fact that a wavelength of light passing through the pattern layer and reflected on the surface of the inorganic material layer changes depending on a wavelength of incident light.

In the present specification, the "light absorbing layer" and the "light reflective layer" are layers having properties relative to each other. The light absorbing layer may mean a layer having higher light absorbance compared to the light reflective layer, and the light reflective layer may mean a layer having higher light reflectivity compared to the light absorbing layer.

The light absorbing layer and the light reflective layer may each be formed in a single layer, or may also be formed in a multilayer of two or more layers.

In the present specification, the light absorbing layer and the light reflective layer are named by their functions. For light having a specific wavelength, a layer reflecting light relatively more may be expressed as the light reflective layer, and a layer reflecting light relatively less may be expressed as the light absorbing layer.

FIG. 27 illustrates a laminated structure of the decoration element of the present disclosure. FIG. 27 illustrates the decoration element including a color developing layer (100) and a substrate (101). The color developing layer (100) includes a light reflective layer (201) and a light absorbing layer (301). FIG. 27 illustrates a structure in which the substrate (101) is provided on the light absorbing layer (301) side of the color developing layer (100), however, the substrate may also be provided on the light reflective layer (201) side.

Through FIG. 28, the light absorbing layer and the light reflective layer are described. In the decoration element of FIG. 28, each layer is laminated in order of a $L_{i-1}$ layer, a $L_i$ layer and a $L_{i+1}$ layer based on a light entering direction, an interface $I_i$ is located between the $L_{i-1}$ layer and the $L_i$ layer, and an interface $I_{i+1}$ is located between the $L_i$ layer and the $L_{i+1}$ layer.

When irradiating light having a specific wavelength in a direction perpendicular to each layer so that thin film interference does not occur, reflectance at the interface $I_i$ may be expressed by the following Mathematical Equation 1.

$$\frac{[n_i(\lambda) - n_{i-1}(\lambda)]^2 + [k_i(\lambda) - k_{i-1}(\lambda)]^2}{[n_i(\lambda) + n_{i-1}(\lambda)]^2 + [k_i(\lambda) + k_{i-1}(\lambda)]^2} \quad \text{[Mathematical Equation 1]}$$

In Mathematical Equation 1, $n_i(\lambda)$ means a refractive index depending on the wavelength ($\lambda$) of the $i^{th}$ layer, and $k_i(\lambda)$ means an extinction coefficient depending on the wavelength ($\lambda$) of the $i^{th}$ layer. The extinction coefficient is a measure capable of defiling how strongly a subject material absorbs light at a specific wavelength, and the definition is the same as the definition to provide later.

Using Mathematical Equation 1, when a sum of reflectance for each wavelength at the interface $I_i$ calculated at each wavelength is $R_i$, $R_i$ is as in the following Mathematical Equation 2.

$$R_i = \frac{\sum_{\lambda=380nm}^{\lambda=780nm} \frac{[n_i(\lambda) - n_{i-1}(\lambda)]^2 + [k_i(\lambda) - k_{i-1}(\lambda)]^2}{[n_i(\lambda) + n_{i-1}(\lambda)]^2 + [k_i(\lambda) + k_{i-1}(\lambda)]^2} \Delta\lambda}{\sum_{\lambda=380nm}^{\lambda=780nm} \Delta\lambda} \quad \text{[Mathematical Equation 1]}$$

The light absorbing layer preferably has a refractive index (n) of 0 to 8 at a wavelength of 400 nm, and the refractive index may be from 0 to 7, may be from 0.01 to 3, and may be from 2 to 2.5. The refractive index (n) may be calculated by sin θa/sin θb (θa is an angle of light entering a surface of the light absorbing layer, and θb is a refraction angle of light inside the light absorbing layer).

The light absorbing layer preferably has a refractive index (n) of 0 to 8 in a wavelength range of 380 nm to 780 nm, and the refractive index may be from 0 to 7, may be from 0.01 to 3, and may be from 2 to 2.5.

The light absorbing layer has an extinction coefficient (k) of greater than 0 and less than or equal to 4 at a wavelength of 400 nm, and the extinction coefficient is preferably from 0.01 to 4, may be from 0.01 to 3.5, may be from 0.01 to 3, and may be from 0.1 to 1. The extinction coefficient (k) is $-\lambda/4\pi I$ (dI/dx) (herein, a value multiplying $\lambda/4\pi$ with dI/I, a reduced fraction of light intensity per a path unit length (dx), for example 1 m, in the light absorbing layer, and herein, $\lambda$ is a wavelength of light).

A principle of a light absorbing layer having specific extinction coefficient and refractive index developing colors as above and a principle of color development of a decoration element developing colors by adding a dye to an existing substrate are different. For example, using a method of absorbing light by adding a dye to a resin, and using a material having an extinction coefficient as described above lead to different light absorption spectra. When absorbing light by adding a dye to a resin, an absorption wavelength band is fixed, and only a phenomenon of varying an absorption amount depending on the changes in the coating thickness occurs. In addition, in order to obtain a target light absorption amount, changes in the thickness of at least a few micrometers or more are required to adjust the light absorption amount. On the other hand, in materials having an extinction coefficient, a wavelength band absorbing light changes even when the thickness changes by a several to tens of nanometer scale.

In addition, when adding a dye to an existing resin, only specific colors by the dye are developed, and therefore, various colors may not be displayed. On the other hand, by the light absorbing layer of the present disclosure using a specific material instead of a resin, an advantage of displaying various colors is obtained by an interference phenomenon of light without adding a dye.

In the light absorbing layer, light absorption occurs in an entering path and a reflection path of light, and by the light reflecting on each of a surface of the light absorbing layer and an interface of light absorbing layer (301) and the light reflective layer (201), the two reflected lights go through constructive or destructive interference.

The light reflected on the surface of the light absorbing layer may be expressed as surface reflected light, and the light reflected on the interface of the light absorbing layer and the light reflective layer may be expressed as interface reflected light. A mimetic diagram of such a working principle is illustrated in FIG. 29. FIG. 29 illustrates a structure in which a substrate (101) is provided on the light reflective layer (201) side, however, the structure is not limited to such a structure, and the substrate (101) may be disposed on other locations.

The decoration element includes a substrate (101) provided on any one or more of a surface facing the light absorbing layer (301) of the light reflective layer (201); or a surface facing the light reflective layer of the light absorbing layer. For example, the substrate may be provided on a surface opposite to the surface facing the light absorbing layer of the light reflective layer (FIG. 30(*a*)); or a surface opposite to the surface facing the light reflective layer of the light absorbing layer (FIG. 30(*b*)).

The substrate may include a plastic injection mold or a glass substrate for a cosmetic container. In addition, the plastic injection mold may be a plate-type plastic injection mold without curves (specific pattern), or may be a plastic injection mold having curves (specific pattern).

The plastic injection mold may be prepared using a plastic molding method. The plastic molding method includes compression molding, injection molding, air blow molding, thermoforming, hotmelt molding, foaming molding, roll molding, reinforced plastic molding and the like. The compression molding is a molding method of placing a material into a mold, heating the result, and applying a pressure thereto, and, as the oldest molding method, this may be mainly used in molding thermo-curable resins such as phenol resins. The injection molding is a molding method of pushing out a plastic melt using a transporting device, and filling a mold therewith through a nozzle, and this method may mold both thermoplastic resins and thermo-curable resins, and is a molding method used the most. The resin used as a cosmetic case is SAN. The air blow molding is a method of molding a product while placing a plastic parison in the center of a mold and injecting air thereto, and, as a molding method of making plastic bottles or small containers, the speed of manufacturing a product is very fast.

As the glass substrate, glass having transmittance of 80% or greater may be used.

The thickness of the substrate may be selected as needed, and, for example, may have a range of 50 μm to 200 μm.

The decoration element further includes a color film on a surface opposite to the surface facing the light reflective layer of the light absorbing layer; between the light absorbing layer and the light reflective layer; or on a surface opposite to the surface facing the light absorbing layer of the light reflective layer. The color film may also perform a role of a substrate. For example, those that may be used as a substrate may be used as a color film by adding a dye or a pigment thereto.

The color film is not particularly limited as long as it has a color difference ΔE*ab, a distance in space of L*a*b* in a color coordinate CIE L*a*b* of the color developing layer, of greater than 1 when the color film is present compared to when the color film is not provided.

Colors may be expressed by CIE L*a*b*, and a color difference may be defined using a distance (ΔE*ab) in L*a*b* space. Specifically, the color difference is $\Delta E = \sqrt{\Delta L^{*2} + \Delta a^{*2} + \Delta b^{*2}}$, and within a range of 0<ΔE*ab<1, an observer may not recognize the color difference [reference document: Machine Graphics and Vision 20(4):383-411]. Accordingly, a color difference obtained by the color film addition may be defined by ΔE*ab>1 in the present specification.

FIG. 31 illustrates a color developing layer including a color film, and FIG. 31(a) illustrates a structure in which a light reflective layer (201), a light absorbing layer (301) and a color film (401) are consecutively laminated, FIG. 31(b) illustrates a structure in which a light reflective layer (201), a color film (401) and a light absorbing layer (301) are consecutively laminated, and FIG. 31(c) illustrates a structure in which a color film (401), a light reflective layer (201) and a light absorbing layer (301) are consecutively laminated.

When the substrate is provided on a surface opposite to the surface facing the light absorbing layer of the light reflective layer, and the color film is located on a surface opposite to the surface facing the light absorbing layer of the light reflective layer, the color film may be provided between the substrate and the light reflective layer; or on a surface opposite to the surface facing the light reflective layer of the substrate. As another example, when the substrate is provided on a surface opposite to the surface facing the light reflective layer of the light absorbing layer, and the color film is located on a surface opposite to the surface facing the light reflective layer of the light absorbing layer, the color film may be provided between the substrate and the light absorbing layer; or on a surface opposite to the surface facing the light absorbing layer of the substrate.

The substrate is provided on a surface opposite to the surface facing the light reflective layer of the light reflective layer, and the color film is further provided. FIG. 32(a) illustrates a structure in which the color film (401) is provided on a surface opposite to the light reflective layer (201) side of the light absorbing layer (301), FIG. 32(b) illustrates a structure in which the color film (401) is provided between the light absorbing layer (301) and the light reflective layer (201), FIG. 32(c) illustrates a structure in which the color film (401) is provided between the light reflective layer (201) and the substrate (101), and FIG. 32(d) illustrates a structure in which the color film (401) is provided on a surface opposite to the light reflective layer (201) side of the substrate (101). FIG. 32(e) illustrates a structure in which the color films (401a, 401b, 401c, 401d) are provided on a surface opposite to the light reflective layer (201) side of the light absorbing layer (301), between the light absorbing layer (301) and the light reflective layer (201), between the light reflective layer (201) and the substrate (101), and on a surface opposite to the light reflective layer (201) side of the substrate (101), respectively, however, the structure is not limited thereto, and 1 to 3 of the color films (401a, 401b, 401c, 401d) may not be included.

The substrate is provided on a surface opposite to the surface facing the light reflective layer of the light absorbing layer, and the color film is further provided. FIG. 33(a) illustrates a structure in which the color film (401) is provided on a surface opposite to the light absorbing layer (301) side of the substrate (101), FIG. 33(b) illustrates a structure in which the color film (401) is provided between the substrate (101) and the light absorbing layer (301), FIG. 33(c) illustrates a structure in which the color film (401) is provided between the light absorbing layer (301) and the light reflective layer (201), and FIG. 33(d) illustrates a structure in which the color film (401) is provided on a surface opposite to the light absorbing layer (301) side of the light reflective layer (201). FIG. 33(e) illustrates a structure in which the color films (401a, 401b, 401c, 401d) are provided on a surface opposite to the light absorbing layer (201) side of the substrate (101), between the substrate (101) and the light absorbing layer (301), between the light absorbing layer (301) and the light reflective layer (201), and on a surface opposite to the light absorbing layer (201) side of the light reflective layer (201), respectively, however, the structure is not limited thereto, and 1 to 3 of the color films (401a, 401b, 401c, 401d) may not be included.

In the structures such as FIG. 32(b) and FIG. 33(c), the light reflective layer may reflect light entering through the color film when the color film has visible light transmittance of greater than 0%, and therefore, colors may be obtained by laminating the light absorbing layer and the light reflective layer.

In the structures such as FIG. 32(c), FIG. 32(d) and FIG. 33(d), light transmittance of the colors developed from the color film of the light reflective layer (201) may be 1% or greater, preferably 3% or greater and more preferably 5% or greater so that changes in the color difference obtained by the color film addition is recognized. This is due to the fact that light transmitted in such a visible light transmittance range may be mixed with colors obtained by the color film.

The color film may be provided as one sheet, or as a laminate of 2 sheets or more that are the same or different types.

As the color film, those capable of developing target colors by being combined with colors developed from the laminated structure of the light reflective layer and the light absorbing layer described above may be used. For example, color films expressing colors by dispersing one, two or more types of pigments and dyes into a matrix resin may be used. Such a color film may be formed by directly coating a composition for forming a color film on a color film-providable location, or a method of preparing a color film by coating a composition for forming a color film on a separate substrate or using a known molding method such as casting or extrusion, and then disposing or attaching the color film on a color film-providable location may be used. As the coating method, wet coating or dry coating may be used.

The pigment and the dye capable of being included in the color film may be selected from among those known in the art and capable of obtaining target colors from a final decoration element, and one, two or more types among pigments and dyes of red-based, yellow-based, purple-based, blue-based, pink-based and the like may be used. Specifically, dyes such as perinone-based red dyes, anthraquinone-based red dyes, methane-based yellow dyes, anthraquinone-based yellow dyes, anthraquinone-based purple dyes, phthalocyanine-based blue dyes, thioindigo-based pink dyes or isoxindigo-based pink dyes may be used either alone or as a combination. Pigments such as carbon black, copper phthalocyanine (C.I. Pigment Blue 15:3), C.I. Pigment Red 112, Pigment blue or isoindoline yellow may be used either alone or as a combination. As such dyes or pigments, those commercially available may be used, and for example, materials manufactured by Ciba ORACET or Chokwang Paint Ltd. may be used. Types of the dyes or pigments and colors thereof are for illustrative purposes only, and various known dyes or pigments may be used, and more diverse colors may be obtained therefrom.

As the matrix resin included in the color film, materials known as materials of transparent films, primer layers, adhesive layers or coating layers may be used, and the matrix resin is not particularly limited to these materials. For example, various materials such as acryl-based resins, polyethylene terephthalate-based resins, urethane-based resins, linear olefin-based resins, cycloolefin-based resins, epoxy-based resins or triacetylcellulose-based resins may be selected, and copolymers or mixtures of the materials illustrated above may also be used.

When the color film is disposed closer to the location observing the decoration element than the light reflective layer or the light absorbing layer as in, for example, the structures of FIGS. 32(a) and (b), and FIGS. 33(a), (b) and (c), light transmittance of the colors developed by the color film from the light reflective layer, the light absorbing layer or the laminated structure of the light reflective layer and the light absorbing layer may be 1% or greater, preferably 3% or greater and more preferably 5% or greater. As a result, target colors may be obtained by combining colors developed from the color film and colors developed from the light reflective layer, the light absorbing layer or the laminated structure thereof.

The thickness of the color film is not particularly limited, and those skilled in the art may select and set the thickness as long as it is capable of obtaining target colors. For example, the color film may have a thickness of 500 nm to 1 mm.

The decoration element includes a pattern layer provided on any one or more of a surface opposite to the surface facing the light absorbing layer of the light reflective layer; between the light reflective layer and the light absorbing layer; or a surface opposite to the surface facing the light reflective layer of the light absorbing layer.

The pattern layer includes a convex portion or concave portion shape having an asymmetric-structured cross-section.

In the present specification, the "cross-section" means a surface when cutting the convex portion or the concave portion in any one direction. For example, the cross-section may mean, when placing the decoration element on the ground, a surface when cutting the convex portion or the concave portion in a direction parallel to the ground or a direction perpendicular to the ground. In the surface of the convex portion or concave portion shape of the pattern layer of the decoration element according to the embodiment, at least one of the cross-sections in a direction perpendicular to the ground has an asymmetric structure.

In the present specification, the "asymmetric-structured cross-section" means a structure in which a figure formed with borders of the cross-section does not have line symmetry or point symmetry. Line symmetry refers to having a property of overlapping when mirroring a certain figure centering on a straight line. Point symmetry refers to, when a certain figure rotates 180 degrees based on one point, having a symmetrical property completely overlapping the original figure. Herein, the borders of the asymmetric-structured cross-section may be a straight line, a curved line or a combination thereof.

In the present specification, the "convex portion shape" may include one or more "convex portion unit shapes", and the "concave portion shape" may include one or more "concave portion unit shapes". The convex portion unit shape or the concave portion unit shape means a shape including two inclined sides (first inclined side and second inclined side), and is not a shape including three or more inclined sides. When referring to FIG. 41, the convex portion shape (P1) of circle C1 is one convex portion unit shape including a first inclined side and a second inclined side. However, the convex portion shape included in circle C2 includes two convex portion unit shapes. The first inclined side may each be defined as a left inclined side of the convex portion shape or the concave portion shape, and the second inclined side may each mean a right inclined side of the convex portion shape or the concave portion shape.

As described above, the decoration element may develop dichroism by the convex portion or the concave portion having an asymmetric-structured cross-section included in the surface of the pattern layer. Dichroism means different colors being observed depending on a viewing angle. Colors may be expressed by CIE L*a*b*, and a color difference may be defined using a distance ($\Delta E^*ab$) in the L*a*b* space. Specifically, the color difference is $\Delta E = \sqrt{\Delta L^{*2} + \Delta a^{*2} + \Delta b^{*2}}$, and within a range of $0 < \Delta E^*ab < 1$, an observer may not recognize the color difference [reference document: Machine Graphics and Vision 20(4):383-411]. Accordingly, dichroism may be defined by $\Delta E^*ab > 1$ in the present specification.

The decoration element has dichroism of $\Delta E^*ab > 1$. Specifically, a color difference $\Delta E^*ab$, a distance in L*a*b* space in a color coordinate CIE L*a*b* of the whole decoration element, may be greater than 1.

FIG. 34 illustrates a decoration element including the pattern layer according to one embodiment of the present disclosure (substrate and protective layer not shown). The pattern layer surface may have a shape in which a second convex portion (P2) having a smaller height compared to the convex portion is disposed between the convex portions (P1). Hereinafter, the convex portion stated prior to the second convex portion may be referred to as a first convex portion.

FIG. 35 illustrates a decoration element including the pattern layer according to one embodiment of the present disclosure (color developing layer not shown). The pattern layer surface may have a shape further including a concave portion (P3) having a smaller height compared to the convex portion on a tip portion (pointed part) of the convex portion (P1). Such a decoration element may exhibit an effect of an image color softly changing depending on a viewing angle.

The pattern layer includes a convex portion or concave portion shape, and each of the shapes may be arranged in an inversed phase structure.

FIG. 36 illustrates a decoration element including the pattern layer according to one embodiment of the present disclosure. As illustrated in FIG. 36(a), the pattern layer surface may have a shape of a plurality of convex portions being arranged in an inversed phase structure of 180 degrees. Specifically, the pattern layer surface may include a first region (C1) in which the second inclined surface has a larger inclined angle compared to the first inclined surface, and a second region (C2) in which the second inclined surface has a larger inclined angle compared to the first inclined surface. In one example, the convex portion included in the first region may be referred to as a first convex portion (P1), and the convex portion included in the second region may be referred to as a fourth convex portion (P4). As for heights, widths, inclined angles and an angle formed by the first and the second inclined surfaces of the first convex portion (P1) and the fourth convex portion (P4), descriptions provided in the convex portion (P1) may be used in the same manner. As illustrated in FIG. 36(b), it may be constituted such that any one region of the first region and the second region corresponds to an image or a logo, and the other region corresponds to a background part. Such a decoration element may exhibit an effect of an image or logo color softly changing depending on a viewing angle. In addition, a decorative effect of colors of an image or logo part and a background part looking switched depending on a viewing direction.

The first region and the second region may each include a plurality of convex portions. Widths of the first region and the second region and the number of convex portions may be properly controlled depending on the size of a target image or logo.

In the present specification, inclined angles (a2, a3) of the convex portion (P1) may mean angles formed between inclined surfaces (S1, S2) of the convex portion (P1) and a horizontal surface of the pattern layer. Unless particularly mentioned otherwise in the present specification, the first inclined surface may be defined as a left inclined surface of the convex portion, and the second inclined surface may mean a right inclined surface of the convex portion in the drawings.

The convex portion (P1) of the pattern layer has a polygonal cross-section, and may have a column shape extending in one direction. In one embodiment, the cross-section of the convex portion (P1) may be a triangle or a shape further including a small concave portion on a tip portion (pointed part or vertex part) of the triangle.

An angle (a1) formed by the first inclined surface (S1) and the second inclined surface (S2) may be in a range of 80 degrees to 100 degrees. Specifically, the angle (a1) may be 80 degrees or greater, 83 degrees or greater, 86 degrees or greater or 89 degrees or greater, and may be 100 degrees or less, 97 degrees or less, 94 degrees or less or 91 degrees or less. The angle may mean an angle of a vertex formed by the first inclined surface and the second inclined surface. When the first inclined surface and the second inclined surface do not form a vertex with each other, the angle may mean an angle of a vertex in a state forming a vertex by virtually extending the first inclined surface and the second inclined surface.

A difference between an inclined angle of the first inclined surface (a2) and an inclined angle of the second inclined surface (a3) of the convex portion (P1) may be in a range of 30 degrees to 70 degrees. A difference between the inclined angle of the first inclined surface (a2) and the inclined angle of the second inclined surface (a3) may be, for example, 30 degrees or greater, 35 degrees or greater, 40 degrees or greater or 45 degrees or greater, and may be 70 degrees or less, 65 degrees or less, 60 degrees or less or 55 degrees or less. Having an inclined angle difference between the first inclined surface and the second inclined surface in the above-mentioned range may be advantageous in terms of obtaining direction-dependent color expression. In other words, dichroism more significantly appears.

The convex portion (P1) may have a height (H1) of 5 μm to 30 μm. Having the convex portion height in the above-mentioned range may be advantageous in a production process aspect. In the present specification, the convex portion height may mean a shortest distance between a highest part and a lowest part of the convex portion based on the horizontal surface of the pattern layer. As for the descriptions relating to the height of the convex portion, the same numerical range may also be used in the depth of the concave portion described above.

The convex portion (P1) may have a width (W1) 10 μm to 90 μm. Having the convex portion width in the above-mentioned range may be advantages in a process aspect in processing and forming a pattern. The width of the convex portion (P1) may be, for example, 10 μm or greater, 15 μm or greater, 20 μm or greater or 25 μm or greater, and may be 90 μm or less, 80 μm or less, 70 μm or less, 60 μm or less, 50 μm or less, 40 μm or less or 35 μm or less. The descriptions relating to the width may be used in the concave portion described above as well as the convex portion.

A distance between the convex portions (P1) may be from 0 μm to 20 μm. The distance between the convex portions in the present specification may mean, in two adjacent convex portions, a shortest distance between a point where one convex portion ends and a point where another convex portion starts. When properly maintaining the distance between the convex portions, a phenomenon of a reflection area looking dark due to shading when a relatively bright color is to be obtained when looking at the decoration element from an inclined surface side of the convex portion having a larger inclined angle may be improved. Between the convex portions, a second convex portion with a smaller height compared to the convex portion may be present as to be described later. The descriptions relating to the distance may be used in the concave portion described above as well as the convex portion.

A height (H2) of the second convex portion (P2) may be in a range of ⅕ to ¼ of the height (H1) of the first convex portion (P1). For example, a height difference (H1−H2) between the first convex portion and the second convex portion may be from 10 μm to 30 μm. A width (W2) of the second convex portion may be from 1 μm to 10 μm. Specifically, the width (W2) of the second convex portion may be 1 μm or greater, 2 μm or greater, 3 μm or greater, 4 μm or greater or 4.5 μm or greater, and may be 10 μm or less, 9 μm or less, 8 μm or less, 7 μm or less, 6 μm or less or 5.5 μm or less.

The second convex portion may have two inclined surfaces (S3, S4) having different inclined angles. An angle (a4) formed by the two inclined surfaces of the second convex portion may be from 20 degrees to 100 degrees. Specifically, the angle (a4) may be 20 degrees or greater, 30 degrees or greater, 40 degrees or greater, 50 degrees or greater, 60 degrees or greater, 70 degrees or greater, 80 degrees or greater or 85 degrees or greater, and may be 100 degrees or less or 95 degrees or less. An inclined angle difference (a6−a5) between both inclined surfaces of the second convex portion may be from 0 degrees to 60 degrees. The inclined angle difference (a6−a5) may be 0 degrees or greater, 10 degrees or greater, 20 degrees or greater, 30 degrees or greater, 40 degrees or greater or 45 degrees or greater, and may be 60 degrees or less or 55 degrees or less. The second convex portion having a dimension in the above-mentioned range may be advantageous in terms of forming bright color by increasing light inflow from a side surface having a large inclined surface angle.

A height (H3) of the concave portion (P3) may be from 3 μm to 15 μm. Specifically, a height (H3) of the concave portion (P3) may be 3 μm or greater, and may be 15 μm or less, 10 μm or less or 5 μm or less. The concave portion may have two inclined surfaces (S5, S6) having different inclined angles. An angle (a7) formed by the two inclined surfaces of the concave portion may be from 20 degrees to 100 degrees. Specifically, the angle (a7) may be 20 degrees or greater, 30 degrees or greater, 40 degrees or greater, 50 degrees or greater, 60 degrees or greater, 70 degrees or greater, 80 degrees or greater or 85 degrees or greater, and may be 100 degrees or less or 95 degrees or less. An inclined angle difference (a9−a8) between both inclined surfaces of the concave portion may be from 0 degrees to 60 degrees. The inclined angle difference (a9−a8) may be 0 degrees or greater, 10 degrees or greater, 20 degrees or greater, 30 degrees or greater, 40 degrees or greater or 45 degrees or greater, and may be 60 degrees or less or 55 degrees or less. The concave portion having a dimension in the above-mentioned range may be advantageous in terms of adding a color sense on the inclined surface.

The pattern layer includes a convex portion shape, the cross-section of the convex portion shape includes a first inclined side and a second inclined side, and shapes of the first inclined side and the second inclined side are the same as or different from each other, and are each a straight-line shape or a curved-line shape.

FIG. 37 illustrates a decoration element including the pattern layer according to one embodiment of the present specification. The cross-section of the pattern layer has a convex portion shape, and the cross-section of the convex portion shape includes a first region (D1) including a first inclined side and a second region (D2) including a second inclined side. The first inclined side and the second inclined side have a straight-line shape. An angle (c3) formed by the first inclined side and the second inclined side may be from 75 degrees to 105 degrees, or from 80 degrees to 100 degrees. An angle (c1) formed by the first inclined side and the ground and an angle (c2) formed by the second inclined side and the ground are different. For example, a combination of c1 and c2 may be 20 degrees/80 degrees, 10 degrees/70 degrees or 30 degrees/70 degrees.

FIG. 38 illustrates a decoration element including the pattern layer according to one embodiment of the present specification. The cross-section of the pattern layer includes a convex portion shape, and the cross-section of the convex portion shape includes a first region (E1) including a first inclined side and a second region (E2) including a second inclined side. Any one or more of the first inclined side and the second inclined side may have a curved-line shape. For example, the first inclined side and the second inclined side may both have a curved-line shape, or the first inclined side may have a straight-line shape, and the second inclined side may have a curved-line shape. When the first inclined side has a straight-line shape and the second inclined side has a curved-line shape, the angle c1 may be larger than the angle c2. FIG. 38 illustrates a case when the first inclined side has a straight-line shape and the second inclined side has a curved-line shape. An angle formed by the inclined side having a curved-line shape with the ground may be calculated from, when drawing an arbitrary straight line from a point where the inclined side touching the ground to a point where the first inclined side and the second inclined side adjoin, an angle formed by the straight line and the ground. The curved-line-shaped second inclined side may have a different curvature depending on the pattern layer height, and the curved line may have a radius of curvature. The radius of curvature may be 10 times or less than the width (E1+E2) of the convex portion shape. FIG. 38(a) shows a radius of curvature of the curved line being twice the width of the convex portion shape, and FIG. 38(b) shows a radius of curvature of the curved line being the same as the width of the convex portion shape. A ratio of the part (E2) having a curvature with respect to the width (E1+E2) of the convex portion may be 90% or less. FIGS. 38(a) and (b) illustrate a ratio of the part (E2) having a curvature with respect to the width (E1+E2) of the convex portion being 60%.

The cross-section of the convex portion shape may have a polygonal shape of triangle or quadrangle.

FIG. 39 illustrates a decoration element including the pattern layer according to one embodiment of the present specification. The cross-section of the pattern layer has a convex portion shape, and the cross-section of the convex portion shape may have a quadrangle shape. The quadrangle shape may be a general quadrangle shape, and is not particularly limited as long as an inclined angle of each inclined side is different. The quadrangle shape may be a shape left after partially cutting a triangle. For example, a trapezoid that is a quadrangle in which one pair of opposite sides is parallel, or a quadrangle shape in which a pair of opposite sides parallel to each other is not present may be included. The cross-section of the convex portion shape includes a first region (F1) including a first inclined side, a second region (F2) including a second inclined side and a third region (F3) including a third inclined side. The third inclined side may or may not be parallel to the ground. For example, when the quadrangle shape is a trapezoid, the third inclined side is parallel to the ground. Any one or more of the first inclined side to the third inclined side may have a curved-line shape, and descriptions on the curved-line shape are the same as described above. The combined length of F1+F2+F3 may be defined as a width of the convex portion shape, and descriptions on the width are the same as the descriptions provided above.

The pattern layer includes two or more convex portion shapes, and a flat portion may be further included in a part or all of between each convex portion shape.

FIG. 40 illustrates a decoration element including the pattern layer according to one embodiment of the present specification. A flat portion may be included between each convex portion of the pattern layer. The flat portion means a region in which the convex portion is not present. Other than the pattern layer further including a flat portion, descriptions on the remaining constituents (D1, D2, c1, c2, c3, first inclined side and second inclined side) are the same as the descriptions provided above. Meanwhile, a combined length of D1+D2+G1 is defined as a pitch of the pattern, which is different from the width of the pattern described above.

The surface of the convex portion or the concave portion shape includes two or more of the convex portion or concave portion shapes. By having a surface of two or more convex portion or concave portion shapes as above, dichroism may further increase. Herein, the two or more convex portion or concave portion shapes may have a form of repeating identical shapes, however, shapes different from each other may be included.

In the convex portion or concave portion shape having an asymmetric-structured cross-section, at least one cross-section includes two or more sides having different inclined angles, different curvatures, or different side shapes. For example, when two sides among the sides forming at least one cross-section have different inclined angles, different curvatures, or different side shapes, the convex portion or the concave portion has an asymmetric structure.

In the shape of the convex portion or the concave portion, at least one cross-section includes a first inclined side and a second inclined side having different inclined angles.

In the present specification, unless mentioned otherwise, the "side" may be a straight line, but is not limited thereto, and a part or all thereof may be a curved line. For example, the side may include a structure of a part of an arc of a circle or oval, a wave structure or a zigzag.

In the present specification, when the side includes a part of an arc of a circle or an oval, the circle or the oval may have a radius of curvature. The radius of curvature may be defined by, when converting an extremely short section of a curved line into an arc, the radius of the arc.

In the present specification, unless mentioned otherwise, the "inclined side" means, when placing the decoration element on the ground, a side having an angle formed by the side with respect to the ground being greater than 0 degrees and less than or equal to 90 degrees. Herein, when the side is a straight line, an angle formed by the straight line and the ground may be measured. When the side includes a curved line, an angle formed by, when placing the decoration element on the ground, the ground and a straight line connecting a point closest to the ground of the side and a point farthest from the ground of the side in a shortest distance may be measured.

In the present specification, unless mentioned otherwise, the inclined angle is an angle formed by, when placing the decoration element on the ground, the ground and a surface or a side forming the pattern layer, and is greater than 0 degrees and less than or equal to 90 degrees. Alternatively, it may mean an angle formed by the ground and a line segment (a'–b') made when connecting a point (a') where a surface or a side forming the pattern layer adjoins the ground and a point (b') where a surface or a side forming the pattern layer is farthest from the ground.

In the present specification, unless mentioned otherwise, the curvature means a degree of changes in the slope of the tangent at continuous points of a side or a surface. As the change in the slope of the tangent at continuous points of a side or a surface is larger, the curvature is high.

In the present specification, the convex portion may be a convex portion unit shape, and the concave portion may be a concave portion unit shape. The convex portion unit shape or the concave portion unit shape means a shape including two inclined sides (first inclined side and second inclined side), and is not a shape including three or more inclined sides. When referring to FIG. 41, the convex portion (P1) of circle C1 is one convex portion unit shape including a first inclined side and a second inclined side. However, the shape included in circle C2 includes two convex portion unit shapes. The first inclined side may be defined as a left inclined side of the convex portion or the concave portion, and the second inclined side may mean a right inclined side of the convex portion or the concave portion.

An angle (a1) formed by the first inclined side and the second inclined side may be in a range of 80 degrees to 100 degrees. Specifically, the angle (a1) may be 80 degrees or greater, 83 degrees or greater, 86 degrees or greater or 89 degrees or greater, and may be 100 degrees or less, 97 degrees or less, 94 degrees or less or 91 degrees or less. The angle may mean an angle of a vertex formed by the first inclined side and the second inclined side. When the first inclined side and the second inclined side do not form a vertex with each other, the angle may mean an angle of a vertex in a state forming a vertex by virtually extending the first inclined side and the second inclined side.

A difference between an inclined angle of the first inclined side (a2) and an inclined angle of the second inclined side (a3) of the convex portion (P1) may be in a range of 30 degrees to 70 degrees. A difference between the inclined angle of the first inclined side (a2) and the inclined angle of the second inclined side (a3) may be, for example, 30 degrees or greater, 35 degrees or greater, 40 degrees or greater or 45 degrees or greater, and may be 70 degrees or less, 65 degrees or less, 60 degrees or less or 55 degrees or less. Having an inclined angle difference between the first inclined side and the second inclined side in the above-mentioned range may be advantageous in terms of obtaining direction-dependent color expression.

FIG. 42 illustrates the pattern layer of a decoration element according to one embodiment of the present specification, and a method for preparing the same. The cross-section of the pattern layer has a convex portion shape, and the cross-section of the convex portion shape may have a shape removing a specific region of the ABO1 triangle shape. A method of determining the removed specific region is as follows. Details on the inclined angles c1 and c2 are the same as the descriptions provided above.

1) An arbitrary point P1 on an AO1 line segment dividing the AO1 line segment in a ratio of L1:L2 is set.

2) An arbitrary point P2 on a BO1 line segment dividing the BO1 line segment in a ratio of m1:m2 is set.

3) An arbitrary point O2 on an AB line segment dividing the AB line segment in a ratio of n1:n2 is set.

4) An arbitrary point P3 on an O1O2 line segment dividing the O2O1 line segment in a ratio of o1:o2 is set.

Herein, the ratios of L1:L2, m1:m2, n1:n2 and o1:o2 are the same as or different from each other, and may be each independently from 1:1,000 to 1,000:1.

5) The region formed by the P1O1P2P3 polygon is removed.

6) The shape formed by the ABP2P3P1 polygon is employed as the cross-section of the convex portion.

The pattern layer may be modified to various shapes by adjusting the ratios of L1:L2, m1:m2, n1:n2 and o1:o2. For example, the height of the pattern may increase when L1 and m1 increase, and the height of the concave portion formed on the convex portion may decrease when of increases, and by adjusting the ratio of n1, the position of a lowest point of the concave portion formed on the convex portion may be adjusted to be closer to any one side of the inclined sides of the convex portion.

FIG. 43 illustrates the pattern layer prepared using the method for preparing the pattern layer of a decoration element according to FIG. 42. When the ratios of L1:L2, m1:m2 and o1:o2 are all the same, the cross-section shape may be a trapezoidal shape. The height of the trapezoid (ha, hb) may vary by adjusting the ratio of L1:L2. For example, FIG. 43(*a*) illustrates a pattern layer prepared when the L1:L2 ratio is 1:1, and FIG. 43(*b*) illustrates a pattern layer prepared when the L1:L2 ratio is 2:1.

The convex portion or concave portion shape of the pattern layer surface may be a cone-shaped convex portion protruding out of the surface of the pattern layer or a cone-shaped concave portion sunk into the surface of the pattern layer.

The cone shape includes a shape of a circular cone, an oval cone or a polypyramid. Herein, the shape of the bottom surface of the polypyramid includes a triangle, a quadrangle, a star shape having 5 or more protruding points, and the like. According to one embodiment, when the pattern layer surface has a cone-shaped convex portion shape when placing the decoration element on the ground, at least one of cross-sections vertical with respect to the ground of the convex portion shape may have a triangle shape. According to another embodiment, when the pattern layer surface has a cone-shaped concave portion shape when placing the decoration element on the ground, at least one of the cross-sections vertical with respect to the ground of the convex portion shape may have an inverted triangle shape.

The cone-shaped convex portion or cone-shaped concave portion shape may have at least one asymmetric-structured cross-section. For example, when observing the cone-shaped convex portion or concave portion from a surface side of the convex portion or concave portion shape, having two or less identical shapes when rotating 360 degrees based on the vertex of the cone is advantageous in developing dichroism. FIG. 44 shows the cone-shaped convex portion shape observed from the surface side of the convex portion shape, and (a) all illustrates a symmetric-structured cone shape, and (b) illustrates an asymmetric-structured cone shape.

When placing the decoration element on the ground, the symmetric-structured cone shape has a structure in which a cross-section in a direction parallel to the ground (hereinafter, referred to as a horizontal cross-section) is a circle or a regular polygon having the same side length, and the vertex of the cone is present on the vertical line with respect to the cross-section of the center of gravity of the horizontal cross-section with respect to the ground. However, the cone shape having an asymmetric-structured cross-section has a structure in which, when observing from a surface side of the cone-shaped convex portion or concave portion, the position of the vertex of the cone is present on a vertical line of a point that is not the center of gravity of the horizontal cross-section of the cone, or has a structure in which the horizontal cross-section of the cone is an asymmetric-structured polygon or oval. When the horizontal cross-section of the cone is an asymmetric-structured polygon, at least one of the sides and the angles of the polygon may be designed to be different from the rest.

For example, as in FIG. 45, the position of the vertex of the cone may be changed. Specifically, when designing the vertex of the cone to be located on a vertical line of the center of gravity (O1) of the horizontal cross-section with respect to the ground of the cone when observing from a surface side of the cone-shaped convex portion shape as in the first drawing of FIG. 45, 4 identical structures may be obtained when rotating 360 degrees based on the vertex of the cone (4-fold symmetry). However, the symmetric structure is broken by designing the vertex of the cone on a position (O2) that is not the center of gravity (O1) of the horizontal cross-section with respect to the ground. When employing a length of one side of the horizontal cross-section with respect to the ground as x, migration distances of the vertex of the cone as a and b, a height of the cone shape, a length of a line vertically connecting from the vertex of the cone (O1 or O2) to the cross-section horizontal with respect to the ground, as h, and an angle formed by the horizontal cross-section and a side surface of the cone as θn, cosine values for Surface 1, Surface 2, Surface 3 and Surface 4 of FIG. 45 may be obtained as follows.

$$\cos(\Theta 1) = \frac{\left(\frac{x}{2}\right)}{sqrt\left(h^2 + \left(\frac{x}{2}\right)^2\right)} \quad \cos(\Theta 3) = \frac{\left(\frac{x}{2} - a\right)}{sqrt\left(h^2 + \left(\frac{x}{2} - a\right)^2\right)}$$

$$\cos(\Theta 2) = \frac{\left(\frac{x}{2}\right)}{sqrt\left(h^2 + \left(\frac{x}{2}\right)^2\right)} \quad \cos(\Theta 4) = \frac{\left(\frac{x}{2} - b\right)}{sqrt\left(h^2 + \left(\frac{x}{2} - b\right)^2\right)}$$

Herein, θ1 and θ2 are the same, and therefore, there is no dichroism. However, θ3 and θ4 are different, and |θ3−θ4| means a color difference (ΔE*ab) between two colors, and therefore, dichroism may be obtained. Herein, |θ3−θ4|>0. As above, how much the symmetric structure is broken, that is, a degree of asymmetry, may be represented quantitatively using an angle formed by the horizontal cross-section with respect to the ground and a side surface of the cone, and the value representing such a degree of asymmetry is proportional to a color difference of dichroism.

FIG. 46 illustrates a surface having a convex portion shape in which a highest point has a line shape, and (a) illustrates a pattern having a convex portion developing no dichroism and (b) illustrates a pattern having a convex portion developing dichroism. An X-X' cross-section of FIG. 46(a) is an isosceles triangle or an equilateral triangle, and a Y-Y' cross-section of FIG. 46(b) is a triangle having different side lengths.

The pattern layer has a surface of a convex portion shape in which a highest point has a line shape or a concave portion shape in which a lowest point has a line shape. The line shape may be a straight-line shape or a curved-line shape, and may include both a curved line and a straight line, or a zigzag shape. This is illustrated in FIG. 47 to FIG. 49. When observing the surface of the convex portion shape in which a highest point has a line shape or the concave portion shape in which a lowest point has a line shape from a surface side of the convex portion or concave portion shape, having only one identical shape when rotating 360 degrees based on the center of gravity of the horizontal cross-section with respect to the ground of the convex portion or the concave portion is advantageous in developing dichroism.

The pattern layer has a surface of a convex portion or concave portion shape in which a cone-type tip portion is cut. FIG. 50 illustrates images obtaining, when placing a decoration element on the ground, an inversed trapezoidal concave portion in which a cross-section perpendicular to the ground is asymmetric. Such an asymmetric cross-section may have a trapezoidal or inversed trapezoidal shape. In this case, dichroism may also be developed by the asymmetric-structured cross-section.

In addition to the structures illustrated above, various surfaces of convex portion or concave portion shapes as in FIG. 51 may be obtained.

In the present specification, unless mentioned otherwise, the "surface" may be a flat surface, but is not limited thereto, and a part or all thereof may be a curved surface. For example, the shape of a cross-section in a direction perpendicular to the surface may include a structure of a part of an arc of a circle or oval, a wave structure or a zigzag.

The pattern layer includes a symmetric-structured pattern. As the symmetric structure, a prism structure, a lenticular lens structure and the like are included.

The pattern layer has a flat portion on a surface opposite to the convex portion or concave portion shape-formed surface, and the flat portion may be formed on a substrate. As the substrate layer, a plastic substrate may be used. As the plastic substrate, triacetyl cellulose (TAC); a cycloolefin copolymer (COP) such as a norbornene derivative; poly (methyl methacrylate (PMMA); polycarbonate (PC); polyethylene (PE); polypropylene (PP); polyvinyl alcohol (PVA); diacetyl cellulose (DAC); polyacrylate (Pac); polyether sulfone (PES); polyetheretherketone (PEEK); polyphenyl sulfone (PPS), polyetherimide (PEI); polyethylene naphthalate (PEN); polyethylene terephthalate (PET); polyimide (PI); polysulfone (PSF); polyarylate (PAR), an amorphous fluorine resin or the like may be used, however, the plastic substrate is not limited thereto.

The pattern layer may include a thermo-curable resin or an ultraviolet-curable resin. As the curable resin, a photo-curable resin or a thermo-curable resin may be used. As the photo-curable resin, an ultraviolet-curable resin may be used. Examples of the thermo-curable resin may include a silicone resin, a silicon resin, a furan resin, a polyurethane resin, an epoxy resin, an amino resin, a phenol resin, a urea resin, a polyester resin, a melamine resin or the like, but are not limited thereto. As the ultraviolet-curable resin, an acrylic polymer, for example, a polyester acrylate polymer, a polystyrene acrylate polymer, an epoxy acrylate polymer, a polyurethane acrylate polymer or a polybutadiene acrylate polymer, a silicone acrylate polymer, an alkyl acrylate polymer or the like may be typically used, however, the ultraviolet-curable resin is not limited thereto.

A color dye may be further included inside or at least one surface of the pattern layer. Including a color dye on at least one surface of the pattern layer may mean a case of, for example, including a color dye on the above-described substrate layer provided on the flat portion side of the pattern layer.

As the color dye, an anthraquinone-based dye, a phthalocyanine-based dye, a thioindigo-based dye, a perinone-based dye, an isoxindigo-based dye, a methane-based dye, a monoazo-based dye, a 1:2 metal complex-based dye and the like may be used.

When including the color dye inside the pattern layer, the dye may be added to the curable resin. When further including the color dye at the bottom of the pattern layer, a method of coating the dye-including layer on the top or the bottom of the substrate layer may be used.

The color dye content may be, for example, from 0 wt % to 50 wt %. The color dye content may determine transmittance and haze ranges of the pattern layer or the decoration element, and the transmittance may be, for example, from 20% to 90%, and the haze may be, for example, from 1% to 40%.

Hereinafter, the present specification will be specifically described with reference to examples, however, the scope of the present specification is not limited by the following examples.

1. Preparation of Film (1) Preparation Example 1: Preparation of Inorganic Material Film Provided with Substrate on the Other Surface A substrate/film laminate was prepared by forming an aluminum oxynitride film (AlON) on a glass substrate.

Specifically, in order to form the film, an aluminum (Al) target was installed on in-line sputter equipment, argon (Ar) gas (80 sccm) and nitrogen ($N_2$) gas (14 sccm) were injected into the chamber, a pressure inside the chamber was maintained at 3 mTorr, and a voltage of 2.1 kW was applied to conduct deposition for 240 seconds.

(2) Preparation Example 2: Preparation of Organic Material Film Provided with Substrate on the Other Surface A substrate/film laminate was prepared by forming an organic material film (polymethyl methacrylate, PMMA) on a silicon (Si) substrate.

Specifically, a solution dissolving polymethyl methacrylate (PMMA) in a toluene solvent in 2 wt % (weight %) was spin coated on a silicon (Si) substrate for 1 minute at a rotation rate of 1,000 rpm, and the result was dried for 30 minutes in an oven to form an organic material film.

2. Test on Reactivity of Deposited Material for Etching Gas (1) Inorganic Material (Aluminum Oxynitride)

In order to test reactivity of aluminum oxynitride for an etching gas ($SF_6$), an aluminum (Al) target was installed on in-line sputter equipment, argon (Ar) gas (80 sccm) and nitrogen ($N_2$) gas (14 sccm) were injected into the chamber, a pressure inside the chamber was maintained at 3 mTorr, and electric power of 1.86 W/cm$^2$ was applied for 80 seconds to deposit aluminum oxynitride on a substrate.

After that, a dry etching process was conducted for the aluminum oxynitride using an etching gas ($SF_6$). Specifically, the etching process was conducted for 120 seconds by, using RIE-ICP equipment, injecting $SF_6$ gas into the chamber at a flow rate of 20 sccm, applying electric power of 100 W to the sample side in an RF manner under a pressure of 5 mTorr, and applying electric power of 800 W to the ICP side. While conducting the process, helium gas (He) was applied to the sample side for cooling.

The result of etching the aluminum oxynitride is shown in FIG. 2. When referring to FIG. 2, it was identified that the aluminum oxynitride of the part other than the area formed with a red dotted line used for fixing the sample was etched. Through this, it was identified that aluminum oxynitride (AlON) had excellent reactivity for the etching gas ($SF_6$).

(2) Organic Material (PMMA)

Reactivity of an organic material (polymethyl methacrylate, PMMA) for an etching gas ($O_2$) was tested.

For the film laminate according to Preparation Example 2, a dry etching process was conducted using an etching gas ($O_2$). Specifically, the etching process was conducted for 60 seconds by, using RIE-ICP equipment, injecting $O_2$ gas into the chamber at a flow rate of 20 sccm, and applying electric power of 100 W in an RF manner.

The result of etching the organic material is shown in FIG. 3. When referring to FIG. 3, it was identified that the organic material of the part other than the area formed with a red dotted line used for fixing the sample was etched. Through this, it was identified that the organic material (PMMA) had excellent reactivity for the etching gas ($O_2$).

In order to form an indium island mask on the silicon substrate-provided organic material film according to Preparation Example 2, an in-line sputter process was used, and as a gas, argon was injected into the chamber at a flow rate of 50 sccm, and electric power of 0.74 W/cm$^2$ was applied under a pressure of 2 mTorr to conduct for 100 seconds.

After that, the film was etched using RIE equipment. Herein, the etching process was conducted for 60 seconds by applying 200 W to the substrate side in an RF type under an environment of injecting $O_2$ gas at a flow rate of 20 sccm into the chamber when the chamber reached a vacuum state of 10 mTorr.

(3) Indium

In order to test reactivity of indium for an etching gas ($SF_6$), an indium (In) target was installed on in-line sputter equipment, argon (Ar) gas (50 sccm) was injected into the chamber, a pressure inside the chamber was maintained at 2 mTorr, and electric power of 1.48 W/cm$^2$ was applied to conduct deposition for 100 seconds.

After that, a dry etching process was conducted using an etching gas ($SF_6$), and the result is shown in FIG. 4. A specific process condition was the same as in the etching process of aluminum oxynitride described above. When referring to FIG. 4, it was identified that indium was hardly etched. Through this, it was identified that indium has low reactivity for $SF_6$, and is a suitable material to be used as a mask when using $SF_6$ as an etching gas.

From the above-described results, it was identified that indium was able to be used as a mask when etching an inorganic material (aluminum oxynitride) with an etching gas.

3. Film Manufacturing Experiment

Shapes of an indium island mask were formed to be different by varying a condition of depositing the indium island mask, and a degree of film etching was compared when etching the film employing each of these as an island mask.

Example 1

In order to form an indium (In) island mask on one surface of the film according to Preparation Example 1, an indium target was installed on in-line sputter equipment, argon (Ar) was injected into the chamber at a flow rate of 50 sccm, and a voltage of 0.37 W/cm$^2$ was applied under a pressure condition of 2 mTorr to conduct a deposition process for 100 seconds. Herein, a distance between the indium target and the thin film inside the chamber was 80 mm, and the deposition was progressed at room temperature (25° C.).

After that, a pattern portion was formed by dry etching the film using the island as a mask. Specifically, the film was etched using RIE-ICP etcher II. Electric power of 800 W was applied to a circular antenna at the top of the chamber to form ICP, and electric power of 100 W was applied to the substrate side.

Herein, the etching was progressed for 2 minutes by injecting $SF_6$ gas at a flow rate of 20 sccm, and during the etching process, the substrate side was cooled by injecting helium gas.

Example 2

The film was etched in the same manner as in Example 1 except that the voltage was changed to 0.74 W/cm$^2$ when forming the indium island mask.

Example 3

The film was etched in the same manner as in Example 1 except that the voltage was changed to 1.48 W/cm$^2$ when forming the indium island mask.

Scanning electron microscope (SEM) images of the film surface before and after the etching processes (dry etching) of Examples 1 to 3 are respectively shown in FIG. 5 to FIG. 7.

In addition, width and height of the island structure shape of the film before the etching processes of Examples 1 to 3 were measured using AFM, and the results are summarized in Table 1.

TABLE 1

|  | Example 1 | Example 2 | Example 3 |
|---|---|---|---|
| Width (nm) | 33.2~68.4 | 64.5~97.7 | 205.1~224.6 |
| Height (nm) | 3.3~8.3 | 13.6~18.9 | 55.0~64.9 |

Reference Example 1

The film was etched in the same manner as in Example 1 except that, using a batch-type chamber in which a distance between the indium target and the thin film was adjusted to a distance of 400 mm, indium was deposited for 1,500 seconds by applying bias electric power of 3.1 W/cm$^2$ under a pressure condition of 5 mTorr. Herein, the height of the indium island mask was 1,500 nm, and shapes of the deposited indium island mask are shown in FIG. 8 and FIG. 9.

Reference Example 2

The film was etched in the same manner as in Reference Example 1 except that indium was deposited for 1800 seconds. Herein, the height of the indium island mask was 2,000 nm, and shapes of the deposited indium island mask are shown in FIG. 10 and FIG. 11.

From the above-described results, it was identified that, in Examples 1 to 3, the indium island mask was present in an island form separated from each other, and the film was effectively etched by using the indium island mask as a mask during the etching process. On the other hand, in Reference Examples 1 and 2, it was identified that the indium island mask was too thick and had a structure connected to each other, and the film was not favorably etched.

Example 4: Etching of Silicon Film

In order to form an indium (In) island mask on one surface of a silicon (Si) film, an indium target was installed on in-line sputter equipment, argon (Ar) was injected into the chamber at a flow rate of 50 sccm, and a voltage of 1.5 W/cm$^2$ was applied under a pressure condition of 2 mTorr to conduct a deposition process for 100 seconds. Herein, a distance between the indium target and the thin film inside the chamber was 80 mm.

After that, the film was etched using RIE-ICP Etcher II. 800 W was applied in an RF type to a circular antenna at the top of the chamber to form ICP, and 100 W was applied to the substrate side.

Herein, the etching was progressed for 120 seconds under an environment of injecting $SF_6$ gas at a flow rate of 20 sccm and a pressure of 5 mTorr, and during the etching process, the substrate side was cooled using helium gas.

Scanning electron microscope (SEM) images of the film surface before and after the etching process of Example 4 are each shown in FIG. 12 to FIG. 13.

From the above-described results, it was identified that the silicon film exposed to the etching gas was etched, and the silicon film not exposed to the etching gas was not etched.

Reference Example 3

The film was etched in the same manner as in Example 4 except that, in order to form the indium island mask on the silicon (Si) film, an indium target was installed on in-line sputter equipment, argon (Ar) was injected into the chamber at a flow rate of 50 sccm, and a voltage of 3 W/cm$^2$ was applied under a pressure condition of 2 mTorr to conduct a deposition process for 1,000 seconds.

Scanning electron microscope (SEM) images of the film surface before and after the etching process of Reference Example 3 are each shown in FIG. 14 to FIG. 15.

From the above-described results, it was identified that the indium island shape and size were not homogeneous, and the etching process was not uniformly conducted.

4. Film Manufacturing Experiment

Changes in the electric resistance value of the manufactured decoration element (film for decoration element) were tested by varying an etching condition of the film (or light absorbing layer).

Comparative Example 1

A glass substrate was introduced to aluminum target-installed in-line sputter equipment, argon (Ar) and nitrogen ($N_2$) were injected into the chamber at a flow rate of 80 sccm and 14 sccm, respectively, and electric power of 3.12 W/cm$^2$ was applied under a pressure condition of 3 mTorr to conduct a deposition process for 80 seconds, and as a result, an aluminum oxynitride (AlON) light absorbing layer was formed on the glass substrate.

After that, the light absorbing layer-formed glass substrate was introduced to indium target-installed in-line sputter equipment, argon (Ar) was injected into the chamber at a flow rate of 50 sccm, and electric power of 1.48 W/cm$^2$ was applied under a pressure condition of 2 mTorr to conduct a deposition process for 100 seconds, and as a result, a decoration element was manufactured by forming an indium light reflective layer on the light absorbing layer.

SEM images of the light reflective layer side of the decoration element are shown in FIG. 16 to FIG. 18.

For the decoration element, electric resistance was measured using 2 point probe-type electric resistance measuring equipment (HIOKI Co., Ltd. product name 324460, Card Hi-tester). Length between the two probes in contact with each other on the sample when measuring the resistance was from 1 cm to 10 cm, and the electric resistance value was recorded after normalizing based on 1 cm.

Herein, the electric resistance value was 50,000Ω.

Example 5

Using RIE-ICP Etcher II, a decoration element was manufactured by etching the light absorbing layer of the decoration element manufactured in Comparative Example 1. ICP power having RF applied to a circular antenna at the top of the chamber at 800 W was formed, and bias RF (RIE) was applied to the substrate side at 100 W.

Herein, the etching was progressed for longer than and equal to 30 seconds and shorter than 60 seconds by injecting $SF_6$ gas at a flow rate of 20 sccm, and during the etching process, the substrate side was cooled by injecting helium gas. Herein, the pressure inside the chamber was 5 mTorr.

Electric resistance was measured in the same manner as in Comparative Example 1, and the electric resistance value was approximately 50,000Ω, which was almost the same as in Comparative Example 1.

Example 6

A decoration element was manufactured in the same manner as in Example 5 except that, when depositing the indium light reflective layer, 3 nm to 8 nm of the indium light reflective layer was formed by changing the electric power to 0.37 W/cm$^2$. Herein, a shortest distance between the light absorbing layer (substrate) and the sputter target was greater than 200 mm.

Images before and after the dry etching process of the decoration element are each shown in FIG. 19 and FIG. 20. From the images, it was identified that the indium light reflective layer was too thin, and the indium mostly disappeared during the etching process. The decoration element is formed with a light absorbing layer and a light reflective layer, and since the light reflective layer disappeared, a function of a decoration element was not able to be performed.

Example 7

A decoration element was manufactured in the same manner as in Example 5 except that the etching time was adjusted to 2 minutes.

SEM images of the light reflective layer side of the decoration element are shown in FIG. 21 to FIG. 23.

Electric resistance was measured in the same manner as in Comparative Example 1, and the electric resistance value was approximately 500,000Ω, which was 10 times as in Comparative Example 1.

Example 8

A decoration element was manufactured in the same manner as in Example 5 except that the etching time was adjusted to 5 minutes.

SEM images of the light reflective layer side of the decoration element are shown in FIG. 24 and FIG. 25.

Electric resistance was measured in the same manner as in Comparative Example 1, and the electric resistance value exceeded the limit of the measuring equipment. The measurement limit of the measuring equipment was approximately 42*10$^6$Ω, and therefore, it was seen that the electric resistance increased by approximately 800 times or greater.

From the results of resistance measurements in the examples and the comparative examples, it was identified that adjusting the etching condition when etching the light absorbing layer changed the degree of etching of the light absorbing layer, and the resistance value of the manufactured decoration element significantly changed as well. Particularly, in Examples 7 and 8, it was identified that the resistance value significantly increased.

The invention claimed is:
1. A method for manufacturing a film for a decoration element, the method comprising:
   depositing two or more islands on one surface of a film; and
   forming a pattern portion by dry etching the film using the island as a mask,
   wherein the mask is not removed after dry etching, and
   wherein each of the two or more islands consists of indium (In).

2. The method for manufacturing a film for a decoration element of claim 1, wherein each of the two or more islands has a width of 10 nm to 1,000 nm, and a height of 5 nm to 1,000 nm.

3. The method for manufacturing a film for a decoration element of claim 1, wherein each of the two or more islands has a horizontal cross-section of 800,000 nm² or less.

4. The method for manufacturing a film for a decoration element of claim 1, wherein each of the two or more islands has a vertical cross-section of 800,000 nm² or less.

5. The method for manufacturing a film for a decoration element of claim 1, wherein the depositing of the two or more islands on one surface of the film is conducted under a temperature condition of 10° C. to 100° C.

6. The method for manufacturing a film for a decoration element of claim 1, wherein the depositing of the two or more islands on one surface of the film uses an evaporation method or a sputtering method.

7. The method for manufacturing a film for a decoration element of claim 6, wherein, in the sputtering method, a shortest distance (d1) between the film and a sputter target is 200 mm or less, and electric power is applied for 10 seconds to 1,000 seconds under an electric power condition of 0.1 W/cm² to 10 W/cm² applied per a unit area of the target.

8. The method for manufacturing a film for a decoration element of claim 6, wherein, in the sputtering method, a shortest distance (d2) between the film and a sputter target is greater than 200 mm, and electric power is applied for 10 seconds to 1,200 seconds under an electric power condition of 1 W/cm² to 10 W/cm² applied per a unit area of the target.

9. The method for manufacturing a film for a decoration element of claim 6, wherein the sputtering method uses argon (Ar), helium (He) or nitrogen (N₂) as a sputter gas.

10. The method for manufacturing a film for a decoration element of claim 1, wherein, in the dry etching, the film is introduced into a chamber, an etching gas is supplied at a flow rate of 5 sccm to 100 sccm, and electric power of 50 W to 1,000 W is applied under a pressure condition of 0.5 mTorr to 100 mTorr.

11. The method for manufacturing a film for a decoration element of claim 1, wherein the dry etching is a method of capacity coupled plasma (CCP) etching, reactive ion etching (RIE), inductively coupled plasma (ICP) etching, electron cyclotron resonance (ECR) plasma etching or microwave etching.

12. The method for manufacturing a film for a decoration element of claim 1, wherein the film comprises metal; an organic material; or an inorganic material.

13. The method for manufacturing a film for a decoration element of claim 12, wherein the metal is one, two or more selected from the group consisting of titanium (Ti), tin (Sn), aluminum (Al), nickel (Ni), vanadium (V), tungsten (W), tantalum (Ta), molybdenum (Mo), neodymium (Nd), iron (Fe), chromium (Cr) and cobalt (Co).

14. The method for manufacturing a film for a decoration element of claim 12, wherein the inorganic material is nitrides of any one of indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nd), iron (Fe), chromium (Cr), cobalt (Co) and silver (Ag); oxides thereof; oxynitrides thereof; or one or more selected from the group consisting of GaAs, AlAs, AlGaAs, GaP, InP, InAs, InGaAs, InSb, CdSe, CdTe, CdS, ZnSe, ZnS, ZnO, GaN, AlGaN, InAlN, HgCdTe and graphene.

* * * * *